US012720735B2

(12) United States Patent
Lee et al.

(10) Patent No.: US 12,720,735 B2
(45) Date of Patent: Aug. 25, 2026

(54) SEMICONDUCTOR MEMORY DEVICE

(71) Applicant: SAMSUNG ELECTRONICS CO., LTD., Suwon-si (KR)

(72) Inventors: Myeong-Dong Lee, Suwon-si (KR); Jongmin Kim, Suwon-si (KR); Taejin Park, Suwon-si (KR); Seung-Bo Ko, Suwon-si (KR); Hui-Jung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 450 days.

(21) Appl. No.: 18/534,400

(22) Filed: Dec. 8, 2023

(65) Prior Publication Data

US 2024/0349491 A1 Oct. 17, 2024

(30) Foreign Application Priority Data

Apr. 14, 2023 (KR) ........................ 10-2023-0049351

(51) Int. Cl.
*H10B 12/00* (2023.01)

(52) U.S. Cl.
CPC ......... *H10B 12/485* (2023.02); *H10B 12/482* (2023.02); *H10B 12/488* (2023.02)

(58) Field of Classification Search
None
See application file for complete search history.

(56) References Cited

U.S. PATENT DOCUMENTS

| | | | | |
|---|---|---|---|---|
| 9,837,490 | B2 | 12/2017 | Park et al. | |
| 10,636,796 | B2 | 4/2020 | Takesako et al. | |
| 10,825,819 | B2 | 11/2020 | Kim et al. | |
| 11,296,088 | B2 | 4/2022 | Hwang et al. | |
| 2016/0049407 | A1 * | 2/2016 | Son ...................... | H10B 12/053 438/270 |
| 2022/0037335 | A1 | 2/2022 | Ma et al. | |
| 2022/0102528 | A1 | 3/2022 | Kim et al. | |

FOREIGN PATENT DOCUMENTS

KR 10-2022-0014387 2/2022

* cited by examiner

*Primary Examiner* — Anthony Ho
(74) *Attorney, Agent, or Firm* — Fish & Richardson P.C.

(57) ABSTRACT

An example semiconductor memory device includes first and second active patterns, which are extended in a first direction and are disposed side by side in a second direction. Each of the first and second active patterns includes first and second edge portions, which are spaced apart from each other in the first direction. A pair of word lines are disposed to cross each of the first and second active patterns, a pair of bit lines are disposed on each of the first and second active patterns and are extended in a third direction, and a storage node contacts on the first edge portion of the first active pattern. When measured in the second direction, a first width of the storage node contact at a first level is larger than a second width at a second level. The first level is lower than the second level.

20 Claims, 22 Drawing Sheets

SEMICONDUCTOR MEMORY DEVICE

CROSS-REFERENCE TO RELATED APPLICATION

This application claims priority to Korean Patent Application No. 10-2023-0049351, filed on Apr. 14, 2023, in the Korean Intellectual Property Office, the disclosure of which is hereby incorporated by reference in its entirety.

BACKGROUND

The present disclosure relates to a semiconductor device, and in particular, to a semiconductor memory device and a method of fabricating the same.

Due to their small-sized, multifunctional, and/or low-cost characteristics, semiconductor devices are being esteemed as important elements in the electronic industry. The semiconductor devices are classified into a semiconductor memory device for storing data, a semiconductor logic device for processing data, and a hybrid semiconductor device including both of memory and logic elements.

Due to the recent increasing demand for electronic devices with a fast speed and/or low power consumption, the semiconductor memory device requires a fast operating speed and/or a low operating voltage. To satisfy the requirement, it is necessary to increase an integration density of the semiconductor memory device. Thus, many studies are being conducted to realize a highly-integrated semiconductor memory device.

SUMMARY

The present disclosure relates to a semiconductor memory device with improved electrical characteristics and high productivity.

In some implementations, a semiconductor memory device may include a first active pattern and a second active pattern, which are extended in a first direction and are disposed side by side in a second direction, each of the first and second active patterns including a first edge portion and a second edge portion, which are spaced apart from each other in the first direction, a pair of word lines disposed to cross each of the first and second active patterns, a pair of bit lines disposed on each of the first and second active patterns and extended in a third direction, and a storage node contact on the first edge portion of the first active pattern. When measured in the second direction, a first width of the storage node contact at a first level may be larger than a second width at a second level. The first level may be lower than the second level, and the first to third directions may be chosen to cross each other.

In some implementations, a semiconductor memory device may include a first active pattern and a second active pattern, which are extended in a first direction and are disposed side by side in a second direction, each of the first and second active patterns including a first edge portion and a second edge portion, which are spaced apart from each other in the first direction, a pair of word lines disposed to cross each of the first and second active patterns, a pair of bit lines disposed on each of the first and second active patterns and extended in a third direction, and a storage node contact on the first edge portion of the first active pattern. The storage node contact may include upper and lower portions which are distinct from each other at a contact level. A width of the lower portion of the storage node contact may be larger than a width of the upper portion, when measured at the contact level in the second direction. The first to third directions may be chosen to cross each other.

In some implementations, a semiconductor memory device may include a first active pattern and a second active pattern, which are extended in a first direction and are disposed side by side in a second direction crossing the first direction, each of the first and second active patterns including a first edge portion and a second edge portion, which are spaced apart from each other in the first direction, a pair of word lines extended in the second direction to cross the first active pattern and the second active pattern, a first storage node contact on the first edge portion of the first active pattern, a second storage node contact on the second edge portion of the second active pattern, a first bit line disposed on the first active pattern and extended in a third direction crossing the first and second directions, a second bit line disposed on the second active pattern and extended in the third direction, a fence pattern between the first and second storage node contacts, landing pads on the first and second storage node contacts, and data storage patterns on the landing pads. The first edge portion of the first active pattern and the first edge portion of the second active pattern may be adjacent to each other in the second direction, and the first edge portion of the first active pattern and the second edge portion of the second active pattern may be adjacent to each other in the third direction. A first width of each of the first and second storage node contacts at a first level may be larger than a second width at a second level, when measured in the second direction, and the first level may be lower than the second level.

DETAILED DESCRIPTION

Example implementations will now be described more fully with reference to the accompanying drawings.

Figure 1:
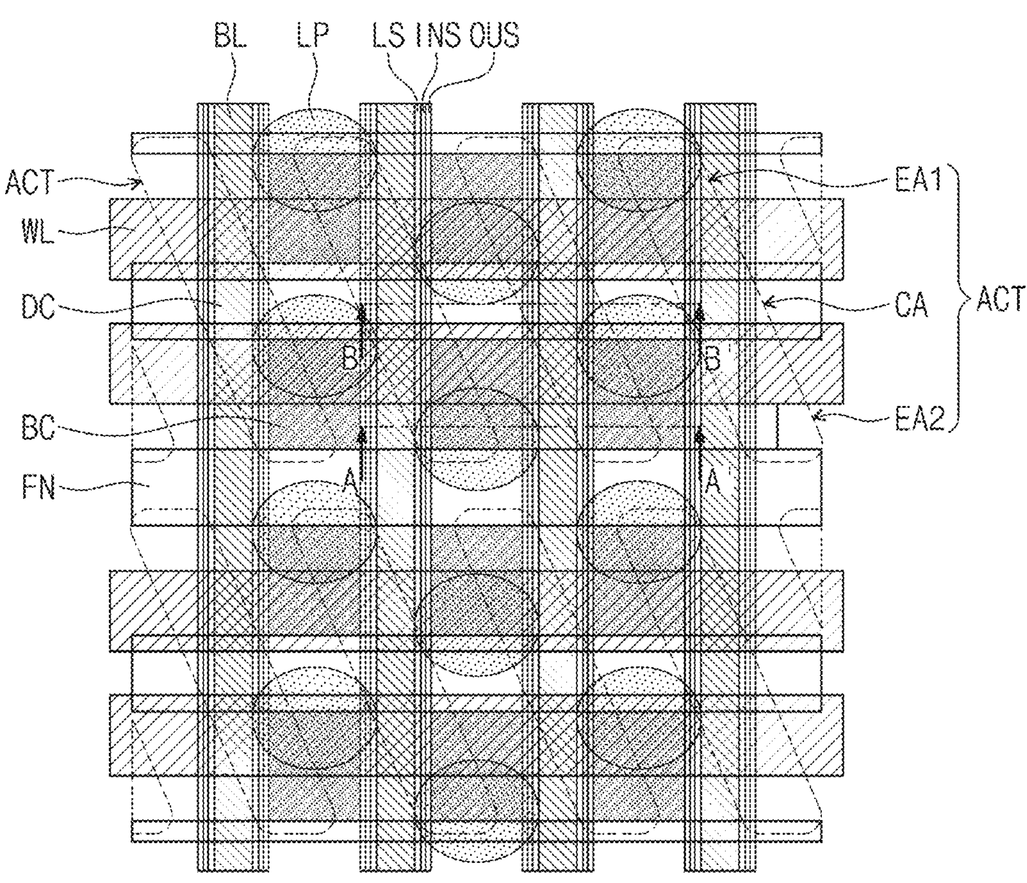
FIG. 1 is a plan view illustrating an example of a semiconductor memory device.
Figure 2:
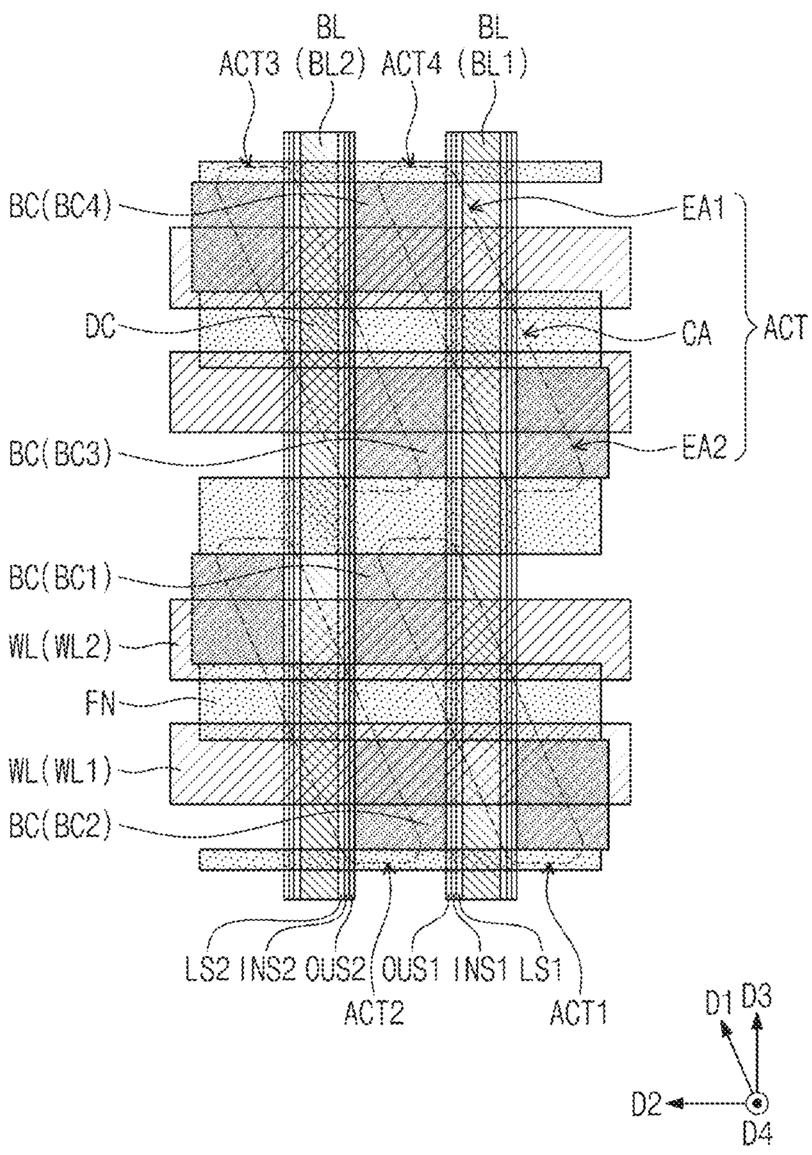
FIG. 2 is an enlarged plan view illustrating an example of a portion of the semiconductor memory device of FIG. 1.
Figure 3A:
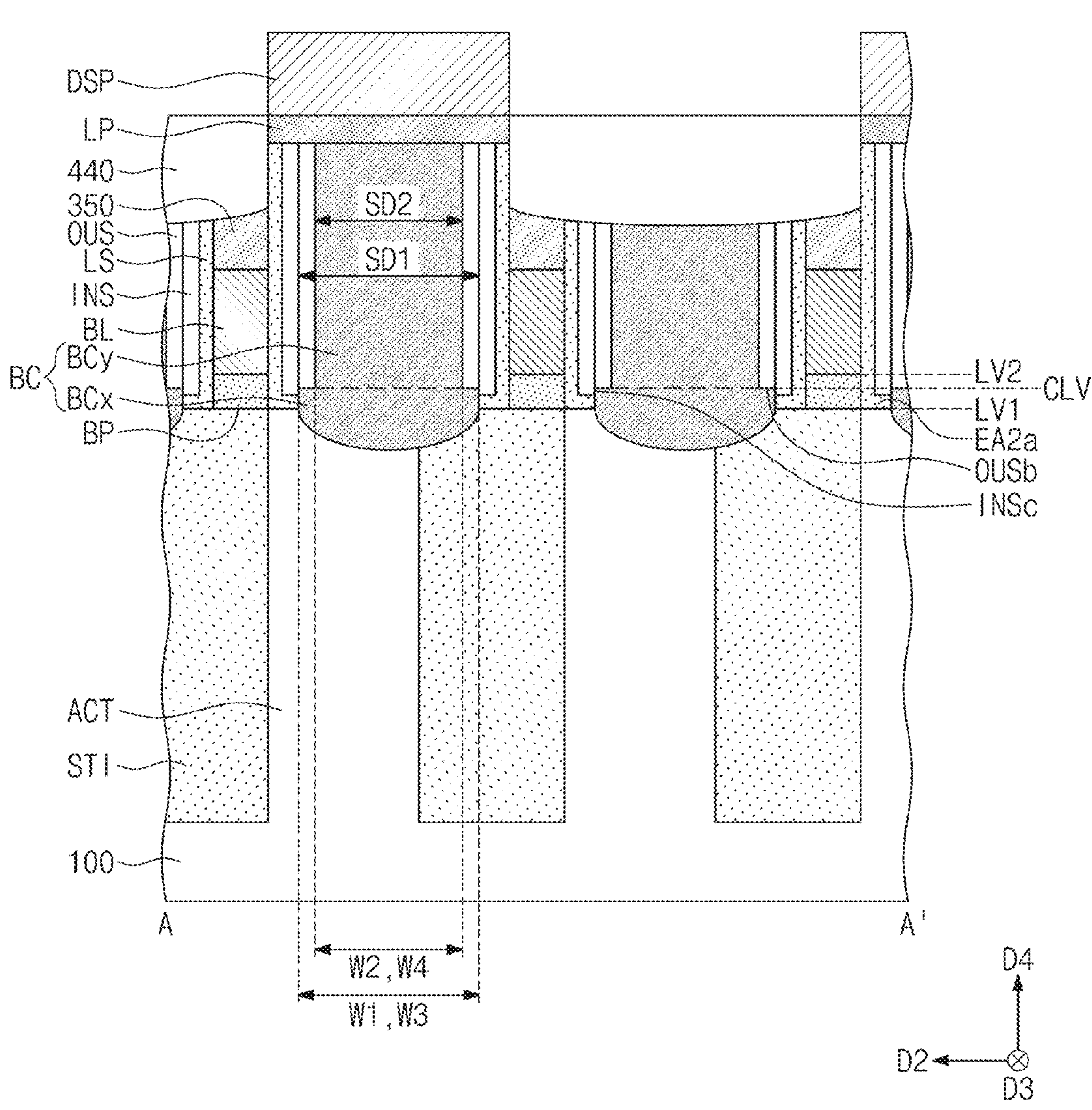
FIGS. 3A and 3B are example sectional views, which are respectively taken along lines A-A' and B-B' of FIG. 1, to illustrate a semiconductor memory device.
Figure 3B:
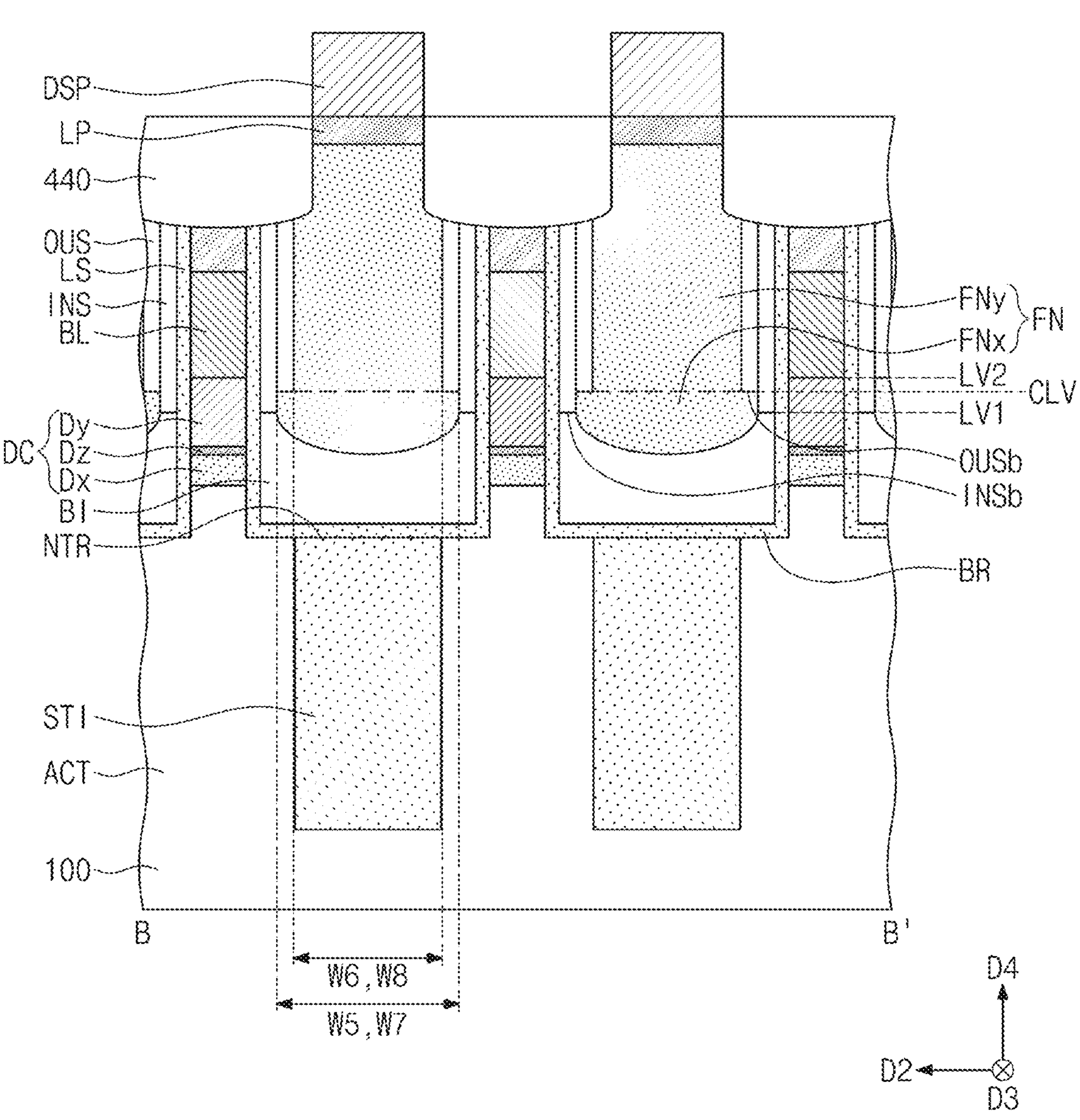

FIG. 1 is a plan view illustrating an example of a semiconductor memory device. FIG. 2 is an enlarged plan view illustrating an example of a portion of the semiconductor memory device of FIG. 1. FIGS. 3A and 3B are example sectional views illustrating a semiconductor memory device. FIG. 3A is an example sectional view taken along a line A-A' of FIG. 1. FIG. 3B is an example sectional view taken along a line B-B' of FIG. 1.

Referring to FIGS. 1 to 4B, a substrate 100 may be provided. The substrate 100 may be a semiconductor substrate (e.g., a silicon wafer, a germanium wafer, or a silicon-germanium wafer).

A device isolation pattern STI may be disposed in the substrate 100 to define an active pattern ACT. In an example, a plurality of active patterns ACT may be provided. The active patterns ACT may include portions of the substrate 100 enclosed by the device isolation pattern STI. In the present specification, for the sake of convenience in explanation, the term "substrate 100" may refer to the remaining portion of the substrate 100, excluding the afore-described portions of the substrate 100, unless otherwise stated.

Each of the active patterns ACT may have a shape that is elongated in a first direction D1 parallel to a bottom surface of the substrate 100. The active patterns ACT may be spaced apart from each other in a second direction D2 and a third direction D3, which are parallel to the bottom surface of the substrate 100 and are non-parallel to each other. The first, second, and third directions D1, D2, and D3 may cross each other. The active patterns ACT may be protruded in a fourth direction D4 that is perpendicular to the bottom surface of the substrate 100. The active pattern ACT may be formed of or include silicon (e.g., single-crystalline silicon).

The active pattern ACT may include a first edge portion EA1, a second edge portion EA2, which is spaced apart from the first edge portion EA1 in the second direction D2, and a center portion CA, which is provided between the first and second edge portions EA1 and EA2. The first and second edge portions EA1 and EA2 may be end portions of the active pattern ACT, which are opposite to each other in the first direction D1. The center portion CA may be interposed between a pair of word lines WL, which will be described below and are provided to cross the active pattern ACT. The center portions CA of the active patterns ACT may be spaced apart from each other in the second and third directions D2 and D3. Impurities (e.g., n-type or p-type impurities) may be provided in the first and second edge portions EA1 and EA2 and the center portion CA.

Adjacent ones of the active patterns ACT may be disposed side by side in at least one of the first, second, and third directions D1, D2, and D3 or opposite directions of them. In the present specification, the expression "adjacent ones of the active patterns ACT are disposed side by side in a specific direction" may mean that the center portions CA of adjacent ones of the active patterns ACT are disposed in the specific direction. In an example, as shown in FIG. 2, a first active pattern ACT1, a second active pattern ACT2, a third active pattern ACT3, and a fourth active pattern ACT4 may be disposed in a clockwise direction. The first active pattern ACT1 and the second active pattern ACT2, which are adjacent to each other, may be disposed side by side in the second direction D2. The first active pattern ACT1 and the third active pattern ACT3, which are adjacent to each other, may be disposed side by side in the first direction D1. The first active pattern ACT1 and the fourth active pattern ACT4, which are adjacent to each other, may be disposed side by side in the third direction D3. The second active pattern ACT2 and the third active pattern ACT3, which are adjacent to each other, may be disposed side by side in the third direction D3.

The first edge portion EA1 of the first active pattern ACT1 and the first edge portion EA1 of the second active pattern ACT2 may be adjacent to each other in the second direction D2. The first edge portion EA1 of the first active pattern ACT1 and the second edge portion EA2 of the second active pattern ACT2 may be adjacent to each other in the third direction D3. The first edge portion EA1 of the first active pattern ACT1 and the second edge portion EA2 of the third active pattern ACT3 may be adjacent to each other and may be spaced apart from each other in the first direction D1.

In some implementations, the active patterns ACT may be disposed side by side in at least one of the first, second, and third directions D1, D2, and D3 or opposite directions of them, and this may make it possible to simplify the disposition of elements in the semiconductor memory device. Accordingly, it may be possible to reduce a process difficulty in a patterning process, which is performed to fabricate a semiconductor memory device, and consequently to easily fabricate the semiconductor memory device. In addition, since the elements can be disposed in a relatively simple manner, an integration density of the semiconductor memory device may also be increased.

The device isolation pattern STI may be formed of or include at least one of insulating materials (e.g., silicon oxide and silicon nitride). The device isolation pattern STI may be a single layer, which is made of a single material, or a composite layer including two or more materials. In the present specification, each of the expressions of "A or B", "at least one of A and B", "at least one of A or B", "A, B, or C", "at least one of A, B, and C", and "at least one of A, B, or C" may be used to represent one of the elements enumerated in the expression or any possible combination of the enumerated elements.

A word line WL may be disposed to cross the active patterns ACT and the device isolation pattern STI. In an example, a plurality of word lines WL may be provided. The word lines WL may be extended in the second direction D2 and may be spaced apart from each other in the third direction D3. A pair of the word line WL, which are spaced apart from each other in the third direction D3, may cross the active patterns ACT, which are adjacent to each other in the second direction D2. The paired word lines WL may cross the active patterns ACT, which are adjacent to each other in the second direction D2. In an example, as shown in FIG. 2, a first word line WL1 and a second word line WL2 may be spaced apart from each other in the third direction D3 and may cross the first and second active patterns ACT1 and ACT2, which are adjacent to each other in the second direction D2.

Each of the word lines WL may include a gate electrode (not shown), a gate dielectric pattern (not shown), and a gate capping pattern (not shown). The gate electrode may be provided to penetrate the active patterns ACT and the device isolation pattern STI in the second direction D2. The gate dielectric pattern may be interposed between the gate electrode and the active patterns ACT and between the gate electrode and the device isolation pattern STI. The gate capping pattern may be provided on the gate electrode to cover a top surface of the gate electrode. The gate electrode may include a conductive material. The gate dielectric pattern may be formed of or include at least one of silicon oxide or high-k dielectric materials. In the present specification, the high-k dielectric material may be defined as a material having a dielectric constant higher than that of silicon oxide. The gate capping pattern may be formed of or include silicon nitride.

A bit line node contact DC may be provided on each of the active patterns ACT, and in an example, a plurality of bit line node contacts DC may be provided. The bit line node contacts DC may be electrically connected to the center portions CA of the active patterns ACT, respectively. The bit line node contacts DC may be spaced apart from each other in the second and third directions D2 and D3. The bit line node contacts DC may be respectively interposed between the active patterns ACT and bit lines BL to be described below. Each of the bit line node contacts DC may electrically connect a corresponding one of the bit lines BL to the center portion CA of a corresponding one of the active patterns ACT. The bit line node contact DC may be formed of or include at least one of silicon (e.g., doped polysilicon) or metallic materials (e.g., Ti, Mo, W, Cu, Al, Ta, Ru, and Ir).

In an example, as shown in FIG. 3B, the bit line node contact DC may include a composite layer including two or more materials and may include a lower contact Dx and an upper contact Dy on the lower contact Dx. As an example, the lower contact Dx may include silicon (e.g., doped polysilicon), and the upper contact Dy may include at least one of metallic materials (e.g., Ti, Mo, W, Cu, Al, Ta, Ru, and Ir). The bit line node contact DC may further include an ohmic contact Dz between the lower contact Dx and the upper contact Dy. As another example, although not shown, the bit line node contact DC may be a single layer made of a single material.

The bit line BL may be provided on the bit line node contact DC. The bit line BL may be extended in the third direction D3. In an example, a plurality of bit lines BL may be provided. The bit lines BL may be spaced apart from each other in the second direction D2. The bit line BL may include a metallic material. As an example, the bit line BL may be formed of or include at least one of metallic materials (e.g., Ti, Mo, W, Cu, Al, Ta, Ru, and Ir). As another example, the bit line BL may be formed of or include at least one of metal silicide materials or metal nitride materials.

The bit line BL may be disposed on the center portions CA of the active patterns ACT, which are arranged in the third direction D3 to form a column, and may be electrically connected to the column of the active patterns ACT through the bit line node contacts DC. In an example, as shown in FIG. 2, a first bit line BL1 may be disposed on and electrically connected to the center portions CA of the first and fourth active patterns ACT1 and ACT4, which are disposed side by side in the third direction D3. A second bit line BL2 may be disposed on and electrically connected to the center portions CA of the second and third active patterns ACT2 and ACT3, which are disposed side by side in the third direction D3. Between the first and second bit lines BL1 and BL2, the first edge portion EA1 of the first active pattern ACT1 may be adjacent to the second edge portion EA2 of the second active pattern ACT2 in the third direction D3.

A buffer pattern BP may be disposed below the bit line BL to cover the substrate 100. The buffer pattern BP may be interposed between the bit line BL and the device isolation pattern STI and between the bit line BL and the second edge portion EA2 of the second active pattern ACT2. The buffer pattern BP may be interposed between the bit line node contacts DC, which are adjacent to each other in the third direction D3. The buffer pattern BP may be formed of or include at least one of silicon oxide, silicon nitride, silicon oxynitride, or high-k dielectric materials. The buffer pattern BP may be a single layer, which is made of a single material, or a composite layer including two or more materials. The buffer pattern BP may be a composite layer including a lower buffer pattern and an upper buffer pattern.

A bit line capping pattern 350 may be provided on a top surface of the bit line BL. The bit line capping pattern 350 may be extended along the bit line BL and in the third direction D3. In an example, a plurality of bit line capping patterns 350 may be provided. The bit line capping patterns 350 may be spaced apart from each other in the second direction D2. The bit line capping pattern 350 may be vertically overlapped with the bit line BL. The bit line capping pattern 350 may be composed of a single layer or a plurality of layers. The bit line capping pattern 350 may include a first capping pattern, a second capping pattern, and a third capping pattern sequentially stacked. Each of the first to third capping patterns may be formed of or include silicon nitride. As another example, the bit line capping pattern 350 may include a plurality of capping patterns, which are stacked to form four or more layers.

A line spacer LS may be provided on a side surface of the bit line BL and a side surface of the bit line capping pattern 350. The line spacer LS may cover the side surface of the bit line BL and the side surface of the bit line capping pattern 350. The line spacer LS may be extended along the side surface of the bit line BL and in the third direction D3. The line spacers LS, which are adjacent to each other in the second direction D2, may be connected to each other by a buried liner BR, which is placed below a fence pattern FN to be described below, but the scope of the technology described herein is not limited to this example. The line spacer LS may be formed of or include at least one of silicon oxide ($SiO_2$), silicon nitride (SiN), silicon oxycarbide (SiOC), or silicon oxycarbonitride (SiOCN). The line spacer LS may be a single layer, which is made of a single material, or a composite layer including two or more materials.

A buried insulating pattern BI may be provided between the bit line node contacts DC, which are adjacent to each other in the second direction D2. The buried insulating pattern BI may be provided below the fence pattern FN, which will be described below. The buried insulating pattern BI may have a concave top surface, which is defined by the fence pattern FN. The buried insulating pattern BI may be in contact with the fence pattern FN at a level that is lower than a top surface of each of the edge portions EA1 and EA2 of the active pattern ACT. The buried liner BR may be interposed between the buried insulating pattern BI and the device isolation pattern STI. The buried insulating pattern BI may be formed of or include at least one of silicon oxide ($SiO_2$) or silicon nitride (SiN). The buried liner BR may be formed of or include at least one of silicon oxide ($SiO_2$), silicon nitride (SiN), silicon oxycarbide (SiOC), or silicon oxycarbonitride (SiOCN).

A storage node contact BC may be provided between adjacent ones of the bit lines BL and ones of the fence patterns FN, which are adjacent to each other in the third direction D3. In an example, a plurality of storage node contacts BC may be provided. The storage node contacts BC may be spaced apart from each other in the second and third directions D2 and D3. Adjacent ones of the storage node contacts BC may be disposed in the second or third directions D2 or D3. The storage node contacts BC may be provided on the first and second edge portions EA1 and EA2 of each of the active patterns ACT. The storage node contacts BC may be electrically connected to the first and second edge portions EA1 and EA2.

In an example, as shown in FIG. 2, each of first to fourth storage node contacts BC1, BC2, BC3, and BC4 may be interposed between the first bit line BL1 and the second bit line BL2. Between the first and second bit lines BL1 and BL2, the first to fourth storage node contacts BC1, BC2, BC3, and BC4 may be spaced apart from each other in the third direction D3. The first to fourth storage node contacts BC1, BC2, BC3, and BC4 may be arranged in the third direction D3 to form a single column. The second storage node contact BC2, the first storage node contact BC1, the third storage node contact BC3, and the fourth storage node contact BC4 may be sequentially disposed to form a single column in the third direction D3. The storage node contact BC may include a conductive material. The storage node contact BC may be formed of or include at least one of silicon (e.g., doped polysilicon) or metallic materials (e.g., Ti, Mo, W, Cu, Al, Ta, Ru, and Ir).

The storage node contact BC may include an upper portion BCy and a lower portion BCx. The upper and lower portions BCy and BCx of the storage node contact BC may be distinct from each other at a contact level CLV. The upper portion BCy of the storage node contact BC may be defined as a portion of the storage node contact BC that is placed at a level higher than the contact level CLV. The lower portion BCx of the storage node contact BC may be defined as another portion of the storage node contact BC that is located at a level lower than the contact level CLV. The upper and lower portions BCy and BCx of the storage node contact BC may be distinct from each other, without an interfacial surface therebetween, at the contact level CLV, and in an example, they may be in contact with each other with an interfacial surface therebetween. The contact level CLV may be defined to be higher than or equal to a first level LV1 and be lower than or equal to a second level LV2. The contact level CLV may be located between the first level LV1 and the second level LV2. The first level LV1 may be defined as a level of the top surface of each of the edge portions EA1 and EA2 of the active pattern ACT. The second level LV2 may be defined as a level of a bottom surface of the bit line BL. The lower portion BCx of the storage node contact BC may be protruding portions that are laterally extended from the upper portion BCy of the storage node contact BC in the second direction D2 and an opposite direction thereof.

The storage node contact BC may have a first width W1, when measured at the first level LV1 in the second direction D2. The storage node contact BC may have a second width W2, when measured at the second level LV2 in the second direction D2. When measured at the contact level CLV, the lower portion BCx of the storage node contact BC may have a third width W3 in the second direction D2, and the upper portion BCy of the storage node contact BC may have a fourth width W4 in the second direction D2. The first width W1 may be larger than the second width W2. The third width W3 may be substantially equal to or larger than the first width W1. The third width W3 may be larger than the second width W2 and the fourth width W4. The second width W2 may be substantially equal to or larger than the fourth width W4.

In some implementations, a width of the lower portion BCx of the storage node contact BC may be larger than a width of the upper portion BCy of the storage node contact BC. In this case, a contact area between the storage node contact BC and the active pattern ACT may be increased. As a result, the electrical characteristics of the semiconductor memory device may be improved.

In addition, even when the storage node contact BC is misaligned in the second direction D2, the storage node contact BC may be in contact with the active pattern ACT. Accordingly, it may be possible to reduce a process failure, which occurs when the storage node contact BC is not in contact with the active pattern ACT, and consequently to improve the productivity in a process of fabricating the semiconductor memory device.

The fence pattern FN may be interposed between adjacent ones of the bit lines BL. The fence pattern FN and the storage node contact BC may be sequentially disposed in the third direction D3. The fence pattern FN may be interposed between the storage node contacts BC, which are adjacent to each other in the third direction D3, and may separate them from each other. In an example, a plurality of fence patterns FN may be provided, and the fence patterns FN may be spaced apart from each other in the second and third directions D2 and D3.

The fence pattern FN may be formed of or include at least one of silicon oxide ($SiO_2$), silicon nitride (SiN), silicon oxycarbide (SiOC), or silicon oxycarbonitride (SiOCN).

The fence pattern FN may include an upper portion FNy and a lower portion FNx. The upper and lower portions FNy and FNx of the fence pattern FN may be distinct from each other at the contact level CLV. The upper portion FNy of the fence pattern FN may be defined as a portion of the fence pattern FN that is placed at a level higher than the contact level CLV. The lower portion FNx of the fence pattern FN may be defined as another portion of the fence pattern FN that is placed at a level lower than the contact level CLV. The upper and lower portions FNy and FNx of the fence pattern FN may be distinct from each other, with an interfacial surface therebetween, at the contact level CLV.

The fence pattern FN may have a fifth width W5, when measured at the first level LV1 in the second direction D2. The fence pattern FN may have a sixth width W6, when measured at the second level LV2 in the second direction D2. When measured at the contact level CLV, the lower portion FNx of the fence pattern FN may have a seventh width W7 in the second direction D2, and the upper portion FNy of the fence pattern FN may have an eighth width W8 in the second direction D2. The fifth width W5 may be larger than the sixth width W6. The seventh width W7 may be substantially equal to or larger than the fifth width W5. The seventh width W7 may be larger than the sixth width W6 and the eighth width W8. The sixth width W6 may be substantially equal to or larger than the eighth width W8.

An inner spacer INS may be provided on the side surface of the bit line BL and the side surface of the bit line capping pattern 350. The inner spacer INS may be extended along the side surface of the bit line BL in the third direction D3. The inner spacer INS may be interposed between the bit line BL and the storage node contact BC and between the bit line BL and the fence pattern FN. In detail, the inner spacer INS may be interposed between the line spacer LS and an outer spacer OUS, which will be described below. The inner spacer INS may be spaced apart from the upper portion BCy of the storage node contact BC by the outer spacer OUS. The bottommost surface INSb of the inner spacer INS may be located at a level lower than the contact level CLV. The bottommost surface INSb of the inner spacer INS may be a surface that is covered with a top surface of the buried insulating pattern BI.

In an example, a plurality of inner spacers INS may be provided. In an example, as shown in FIG. 2, a first inner spacer INS1 may be interposed between the first bit line BL1 and the first storage node contact BC1. A second inner spacer INS2 may be interposed between the second bit line BL2 and the second storage node contact BC2. In an example, as shown in FIGS. 2 and 3A, a side surface of each of the first and second inner spacers INS1 and INS2 may be in contact with the lower portion BCx of each of the first and second storage node contacts BC1 and BC2. A distance between the first and second inner spacers INS1 and INS2 may be a first distance SD1. The first distance SD1 may be a distance between an outer side surface of the first inner spacer INS1 and an outer side surface of the second inner spacer INS2. The first distance SD1 may be substantially equal to the first width W1 and the third width W3. The first distance SD1 may be larger than the second width W2 and the fourth width W4. However, the scope of the technology described herein is not limited to this example.

The inner spacer INS may be formed of or include at least one of silicon oxide ($SiO_2$), silicon nitride (SiN), silicon oxycarbide (SiOC), silicon oxycarbonitride (SiOCN), or low-k dielectric materials. The inner spacer INS may be a single layer, which is made of a single material, or a composite layer including two or more materials.

The outer spacer OUS may be provided on the side surface of the bit line BL and the side surface of the bit line capping pattern 350. The outer spacer OUS may be extended along the side surface of the bit line BL in the third direction D3. The outer spacer OUS may be interposed between the bit line BL and the storage node contact BC and between the bit line BL and the fence pattern FN. In detail, the outer spacer OUS may be interposed between the inner spacer INS and the storage node contact BC and between the inner spacer INS and the fence pattern FN.

In an example, a plurality of outer spacers OUS may be provided. In an example, a first outer spacer OUS1 may be interposed between the first bit line BL1 and the first storage node contact BC1, as shown in FIG. 2. A second outer spacer OUS2 may be interposed between the second bit line BL2 and the second storage node contact BC2. A distance between the first outer spacer OUS1 and the second outer spacer OUS2 may be a second distance SD2. The second distance SD2 may be a distance between an outer side surface of the first outer spacer OUS1 and an outer side surface of the second outer spacer OUS2. The second distance SD2 may be smaller than the first width W1 and the third width W3. The second distance SD2 may be substantially equal to the second width W2 and the fourth width W4. However, the scope of the technology described herein is not limited to this example.

A bottom surface OUSb of the outer spacer OUS may be located at substantially the same level as the contact level CLV. The bottom surface OUSb of the outer spacer OUS may be located at a level higher than the bottommost surface INSb of the inner spacer INS. A portion of the bottom surface OUSb of the outer spacer OUS may be covered with the storage node contact BC, and the other portion may be covered with the fence pattern FN. The bottom surface OUSb of each of the first and second outer spacers OUS1 and OUS2 may be covered with the lower portion BCx of a corresponding one of the first and second storage node contacts BC1 and BC2. Each of the first and second outer spacers OUS1 and OUS2 may be vertically overlapped with the lower portion BCx of a corresponding one of the first and second storage node contacts BC1 and BC2. In the case where the upper and lower portions BCy and BCx of the storage node contact BC have an interfacial surface at the contact level CLV, the bottom surface OUSb of the outer spacer OUS may be located at substantially the same level as a bottom surface of the upper portion BCy of the storage node contact BC and may be coplanar with the bottom surface of the upper portion BCy.

The outer spacer OUS may be formed of or include at least one of silicon oxide ($SiO_2$), silicon nitride (SiN), silicon oxycarbide (SiOC), silicon oxycarbonitride (SiOCN), or low-k dielectric materials. The outer spacer OUS may be a single layer, which is made of a single material, or a composite layer including two or more materials.

A landing pad LP may be provided on the storage node contact BC. In an example, a plurality of landing pads LP may be provided. The landing pads LP may be spaced apart from each other in the second and third directions D2 and D3. The landing pads LP between a pair of the bit lines BL may be arranged in the third direction D3 to form a single column. Each of the landing pads LP may be electrically connected to a corresponding one of the first and second edge portions EA1 and EA2 through a corresponding one of the storage node contacts BC and a corresponding one of the storage node pads XPS.

Each of the landing pads LP may be shifted from a corresponding one of the storage node contacts BC in the third direction D3 or an opposite direction thereof. A portion of the landing pad LP may be vertically overlapped with the corresponding storage node contact BC, and the other portion may not be vertically overlapped with the corresponding storage node contact BC. In an example, the landing pad LP may be formed of or include at least one of metallic materials (e.g., Ti, Mo, W, Cu, Al, Ta, Ru, and Ir).

A filler pattern 440 may be provided to enclose the landing pad LP. The filler pattern 440 may be interposed between adjacent ones of the landing pads LP. When viewed in a plan view, the filler pattern 440 may be provided in a mesh shape with holes, and in this case, the landing pads LP may be provided in the holes to penetrate the filler pattern 440. The filler pattern 440 may be formed of or include at least one of silicon nitride, silicon oxide, silicon oxynitride, or combinations thereof. Alternatively, the filler pattern 440 may include an empty space with an air layer (i.e., an air gap).

A data storage pattern DSP may be provided on the landing pad LP. In an example, a plurality of data storage patterns DSP may be provided. The data storage patterns DSP may be spaced apart from each other in the second and third directions D2 and D3. Each of the data storage patterns DSP may be electrically connected to a corresponding one of first and second edge portions EA1 and EA2 through a corresponding one of the landing pads LP, a corresponding one of the storage node contacts BC, and a corresponding one of the storage node pads XPS.

In an example, the data storage pattern DSP may be a capacitor including a bottom electrode, a dielectric layer, and a top electrode. In this case, the semiconductor memory device may be a dynamic random access memory (DRAM) device. In an example, the data storage pattern DSP may include a magnetic tunnel junction pattern. In this case, the semiconductor memory device may be a magnetic random access memory (MRAM) device. In an example, the data storage pattern DSP may be formed of or include a phase-change material or a variable resistance material. In this case, the semiconductor memory device may be a phase-change random access memory (PRAM) device or a resistive random access memory (ReRAM) device. However, the scope of the technology described herein is not limited to these examples, and the data storage pattern DSP may include various structures and/or materials which can be used to store data.

Figure 4A:
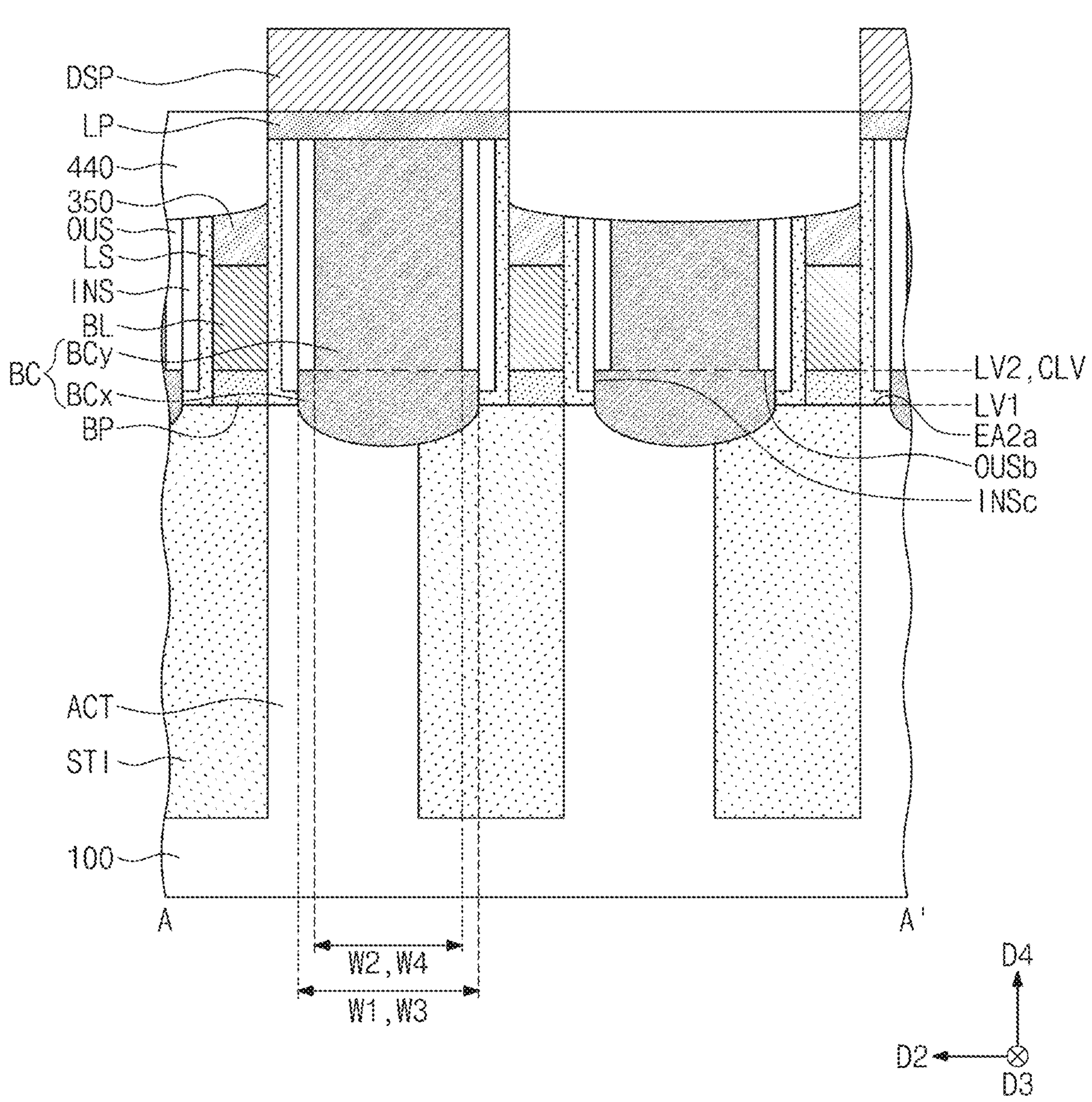
FIGS. 4A and 4B are example sectional views, which are respectively taken along the lines A-A' and B-B' of FIG. 1, to illustrate a semiconductor memory device.
Figure 4B:
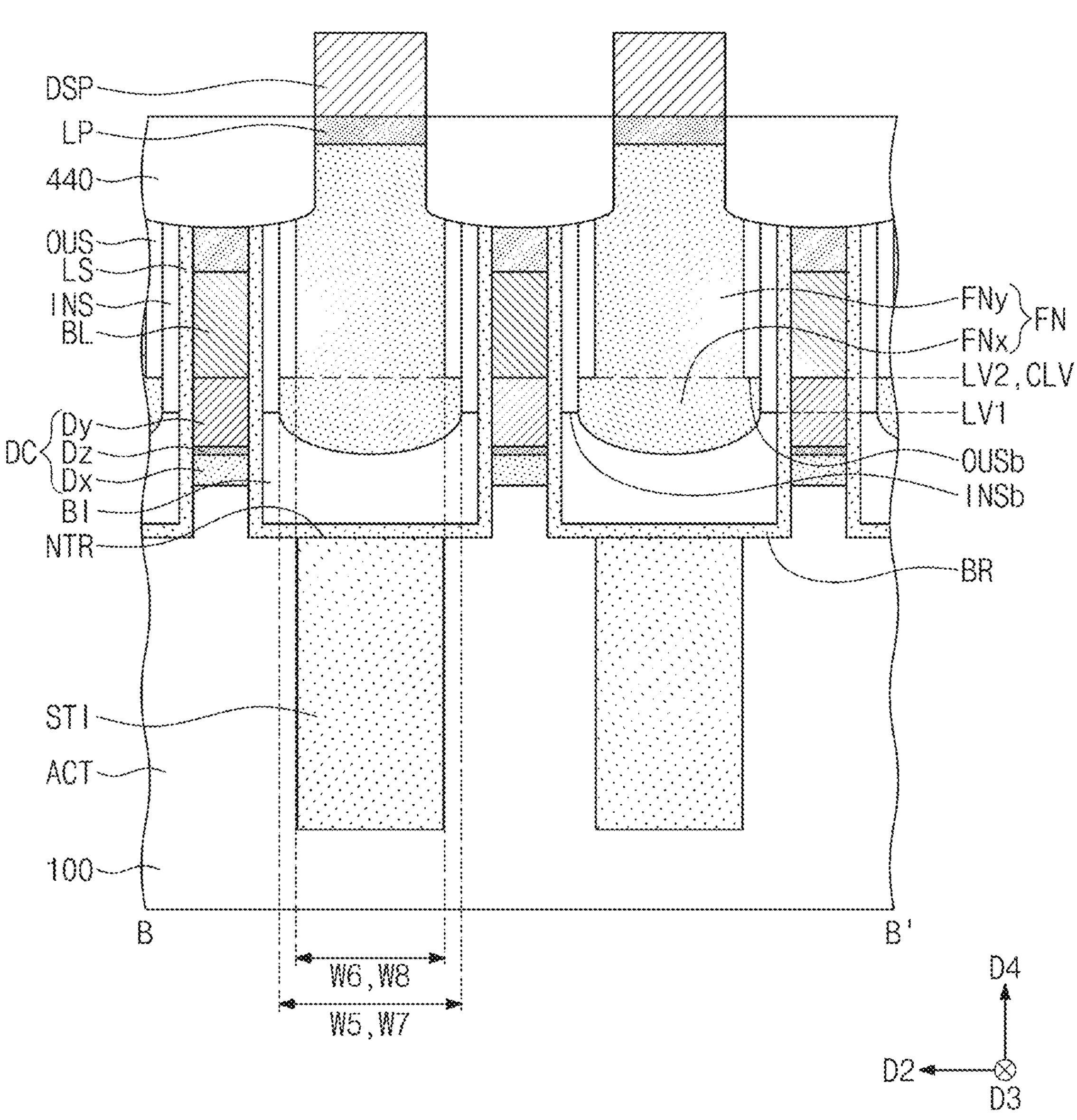

FIGS. 4A and 4B are example sectional views which are respectively taken along lines A-A' and B-B' of FIG. 1 to illustrate a semiconductor memory device. A semiconductor memory device will be described in more detail with reference to FIGS. 4A and 4B. For concise description, a previously-described element may be identified by the same reference number without repeating an overlapping description thereof.

The contact level CLV may be defined to be equal to the second level LV2. The upper and lower portions BCy and BCx of the storage node contact BC may be distinct from each other, without an interfacial surface therebetween, at the second level LV2. The upper and lower portions BCy and BCx of the storage node contact BC may be distinct from each other, without an interfacial surface therebetween, at the second level LV2. The first width W1 may be substantially equal to or smaller than the third width W3. The second width W2 may be substantially equal to the fourth width W4.

The lower portion BCx of the storage node contact BC may be in contact with a portion INSc of a side surface of the inner spacer INS in a region lower than the second level LV2. The upper portion BCy of the storage node contact BC may be spaced apart from the inner spacer INS (e.g., the other portion of the side surface of the inner spacer INS) by the outer spacer OUS, in a region higher than the second level LV2.

The bottom surface OUSb of the outer spacer OUS may be located at a level higher than the bottommost surface INSb of the inner spacer INS. The bottom surface OUSb of the outer spacer OUS may be located at substantially the same level as the second level LV2.

The upper and lower portions FNy and FNx of the fence pattern FN may be distinct from each other, without an interfacial surface therebetween, at the second level LV2. The fifth width W5 may be substantially equal to or smaller than the seventh width W7. The sixth width W6 may be substantially equal to the eighth width W8.

Figure 5A:
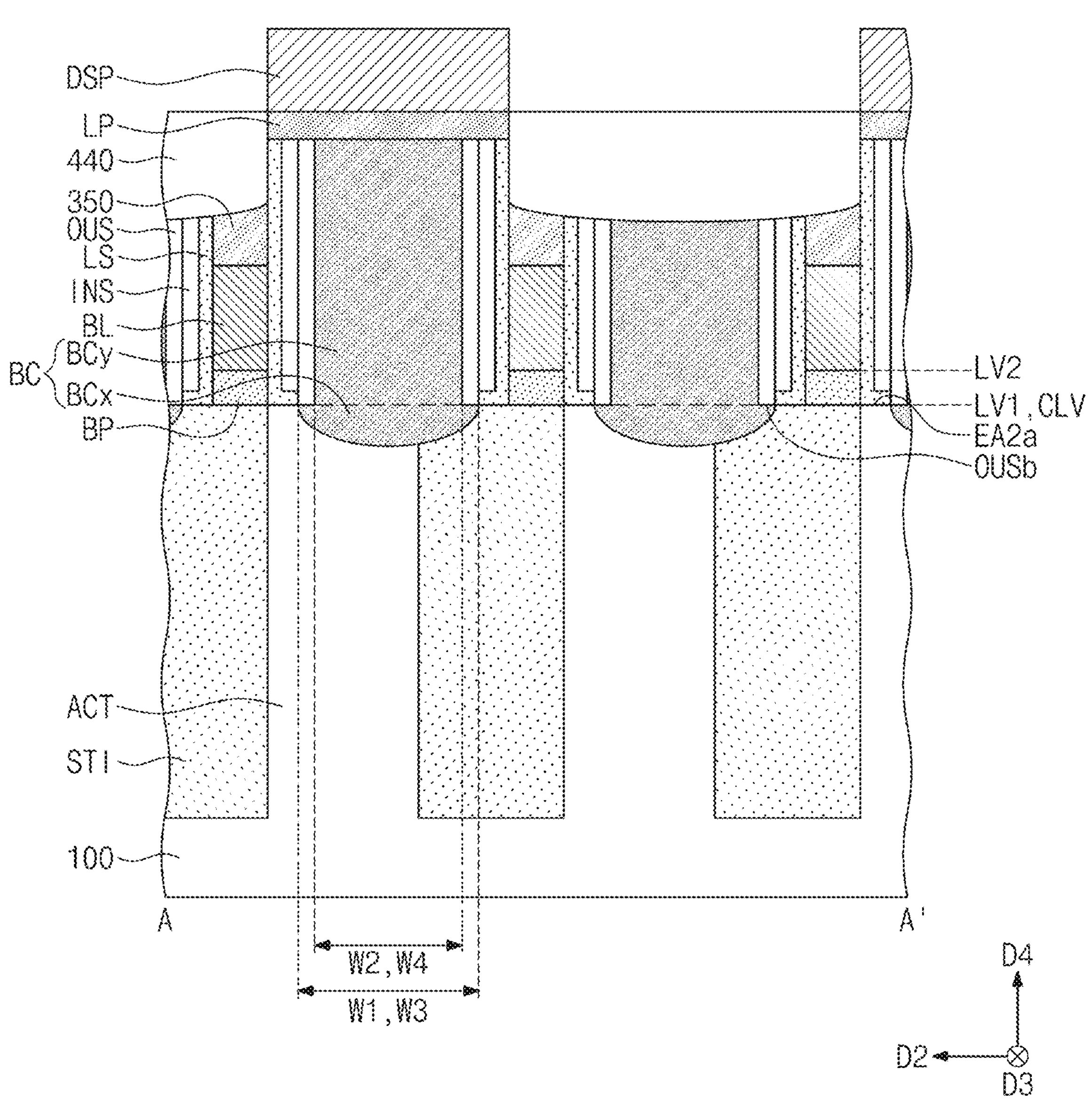
FIGS. 5A and 5B are example sectional views, which are respectively taken along the lines A-A' and B-B' of FIG. 1, to illustrate a semiconductor memory device.
Figure 5B:
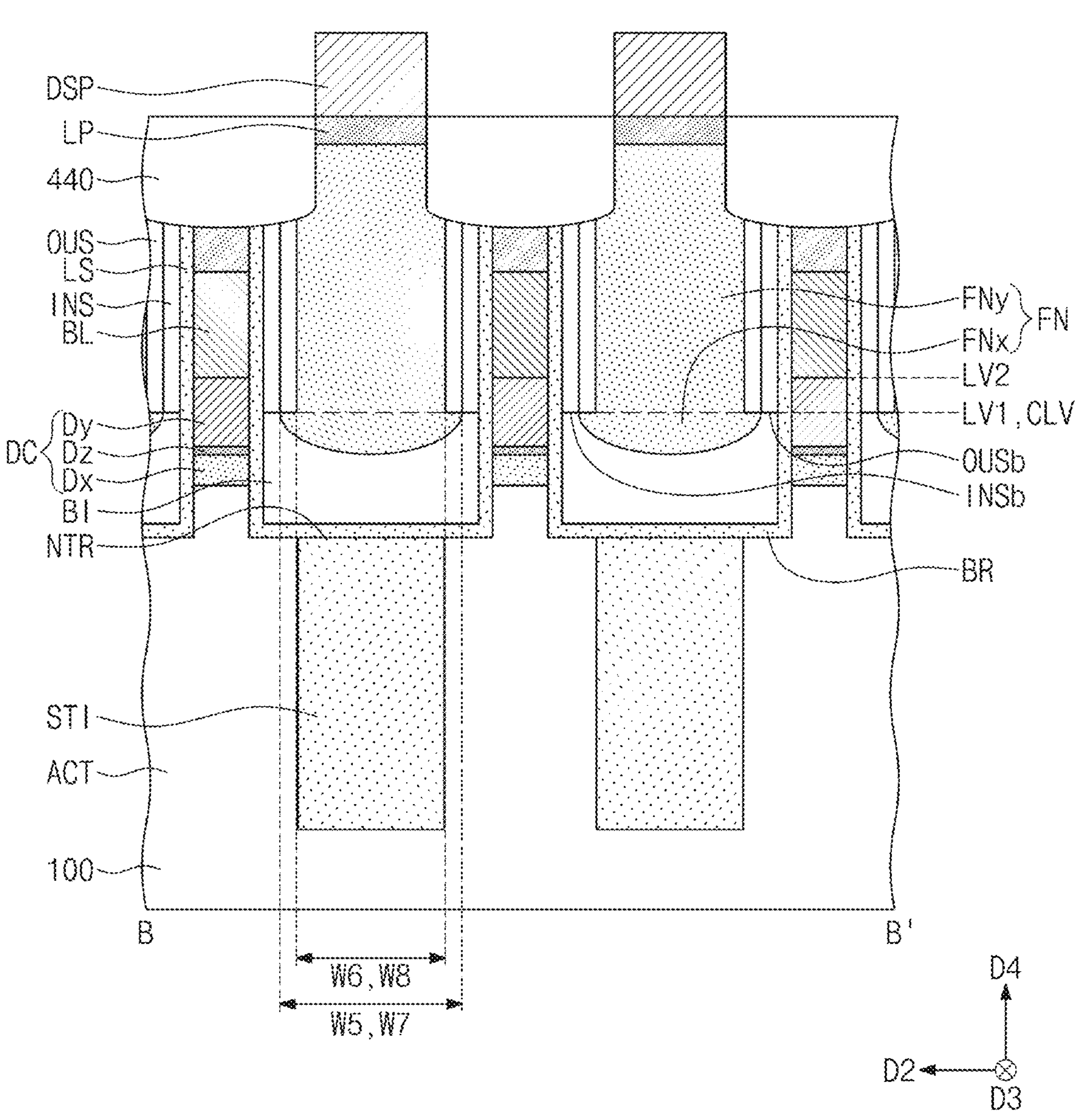

FIGS. 5A and 5B are example sectional views which are respectively taken along the lines A-A' and B-B' of FIG. 1 to illustrate a semiconductor memory device. A semiconductor memory device will be described in more detail with reference to FIGS. 5A and 5B. For concise description, a previously-described element may be identified by the same reference number without repeating an overlapping description thereof.

The contact level CLV may be defined to be equal to the first level LV1. The upper and lower portions BCy and BCx of the storage node contact BC may be distinct from each other, without an interfacial surface therebetween, at the first level LV1. The upper and lower portions BCy and BCx of the storage node contact BC may be distinct from each other, with an interfacial surface therebetween, at the first level LV1. The first width W1 may be substantially equal to the third width W3. The second width W2 may be substantially equal to or larger than the fourth width W4. The lower portion BCx of the storage node contact BC may not be in contact with the side surface of the inner spacer INS.

The bottom surface OUSb of the outer spacer OUS may be located at substantially the same level as the bottommost surface INSb of the inner spacer INS. The bottom surface OUSb of the outer spacer OUS and the bottommost surface INSb of the inner spacer INS may be located at substantially the same level as the first level LV1.

The upper and lower portions FNy and FNx of the fence pattern FN may be distinct from each other, without an interfacial surface therebetween, at the first level LV1. The fifth width W5 may be substantially equal to the seventh width W7. The sixth width W6 may be substantially equal to or larger than the eighth width W8.

Hereinafter, a method of fabricating a semiconductor memory device will be described in more detail with reference to FIGS. 6A to 12B. In the following description, a previously-described element may be identified by the same reference number without repeating an overlapping description thereof, for concise description.

FIGS. 6A to 10B are sectional views illustrating an example of a method of fabricating a semiconductor memory device. In detail, FIGS. 6A, 7A, 8A, 9A, and 10A are example sectional views corresponding to the line A-A' of FIG. 1. FIGS. 6B, 7B, 8B, 9B, and 10B are example sectional views corresponding to the line B-B' of FIG. 1.

Figure 6A:
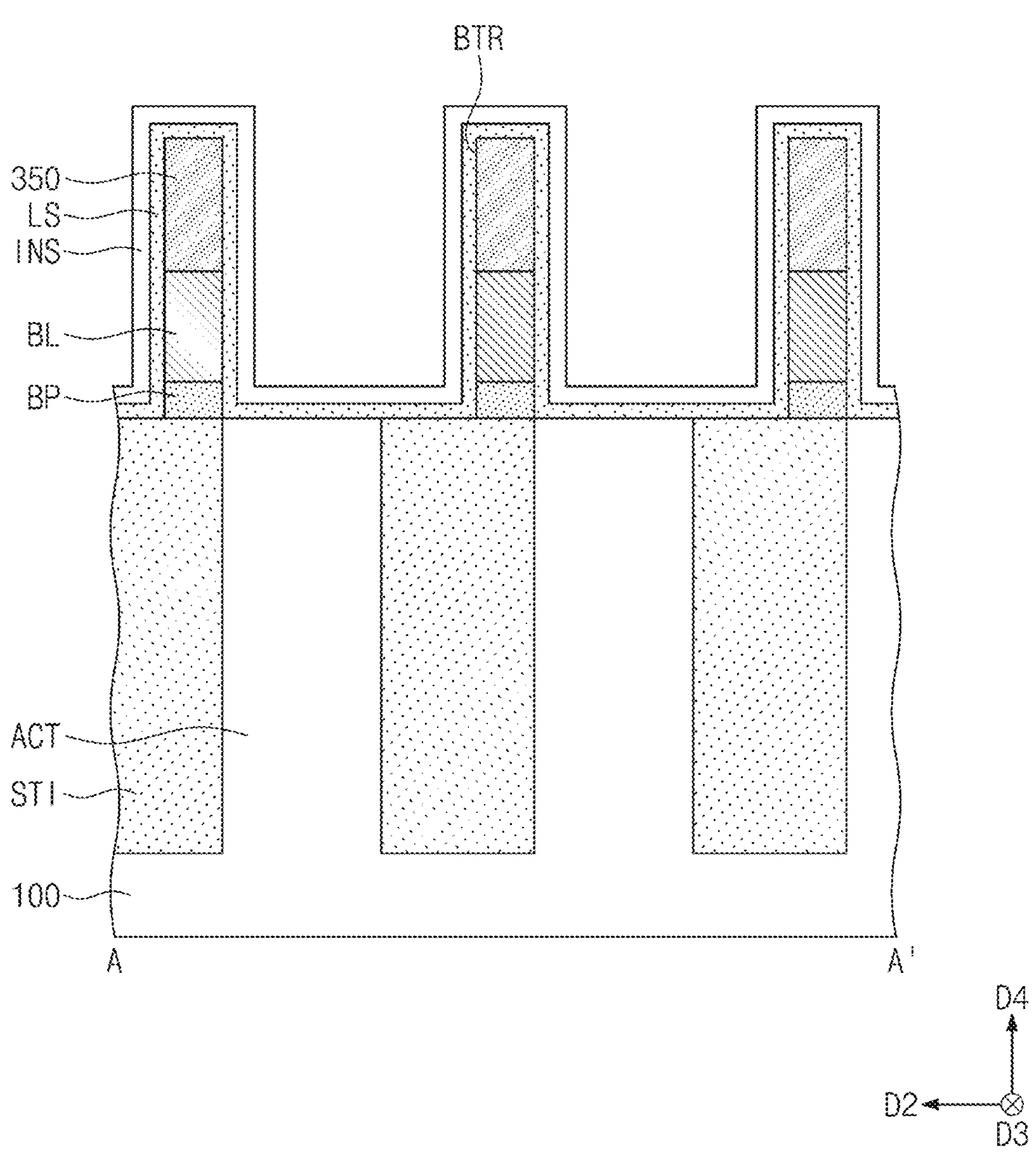
FIGS. 6A to 10B are sectional views illustrating an example of a method of fabricating a semiconductor memory device.
Figure 6B:
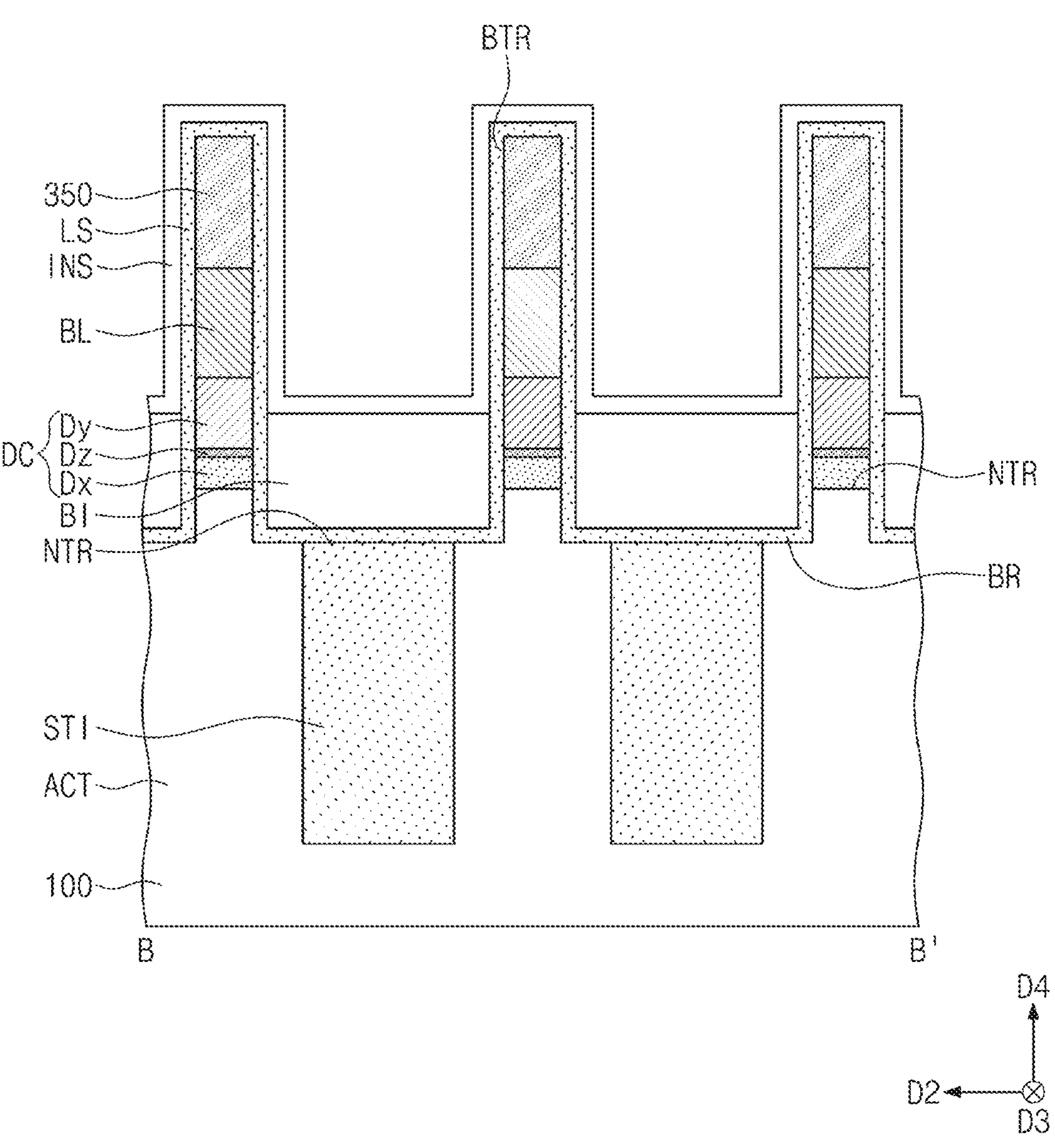

Referring to FIGS. 1, 6A, and 6B, the substrate 100 may be prepared. The active patterns ACT may be formed by performing a patterning process on the substrate 100. As a result of the patterning process, a trench region may be formed between the active patterns ACT.

The patterning process may include forming mask patterns on the substrate 100 using an exposure process and etching the substrate 100 using the mask patterns as an etch mask. In an example, the exposure process and the etching process may be alternately repeated several times. A first exposing/etching process may be performed to form line patterns and first trench regions, which are extended in the first direction D1. Thereafter, a second exposing/etching process may be performed on the line patterns. As a result of the second exposing/etching process, second trench regions may be formed to extend in the second direction D2, and each of the line patterns may be divided into the active patterns ACT, which are arranged in the first direction D1.

The device isolation pattern STI may be formed to fill the first and second trench regions. The formation of the device isolation pattern STI may further include performing a physical vapor deposition (PVD) process, a chemical vapor deposition (CVD) process, or an atomic layer deposition (ALD) process.

Next, the word line WL may be formed to cross the active pattern ACT and the device isolation pattern STI. The formation of the word line WL may include forming a mask pattern on the active pattern ACT and the device isolation pattern STI, performing an anisotropic etching process using the mask pattern to form a word line trench region WTR, and filling the word line trench region WTR with the word line WL.

The filling of the word line WL may include conformally depositing a gate dielectric pattern on an inner surface of the word line trench region WTR, filling the word line trench region WTR with a conductive layer, performing an etch-back and/or polishing process on the conductive layer to form a gate electrode, and forming a gate capping pattern on the gate electrode to fill a remaining portion of the word line trench region WTR.

A buffer layer (not shown) may be formed to cover the entire top surface of the substrate 100. The buffer layer may include two or more buffer layers which are stacked, but the scope of the technology described herein is not limited to this example.

Thereafter, node trench regions NTR may be formed by etching the buffer layer. Each of the node trench regions NTR may be a line-shaped trench region, which is extended in a specific direction. The node trench regions NTR may be extended in the second direction D2 and may be spaced apart from each other in the third direction D3. The node trench regions NTR may be formed on the center portions CA of the active patterns ACT. The center portions CA of the active patterns ACT may be exposed through the node trench regions NTR.

A bit line node contact layer (not shown) may be formed to fill the node trench regions NTR. A bit line layer (not shown) and a bit line capping layer (not shown) may be sequentially formed to cover the entire top surface of the substrate 100.

Thereafter, the bit line capping pattern 350, the bit line BL, and the bit line node contact DC may be formed through an etching process. The bit line capping pattern 350, the bit line BL, and the bit line node contact DC may be formed from the bit line capping layer, the bit line layer, and the bit line node contact layer, respectively, through the etching process. An upper portion of the buffer layer may also be etched during this process.

During the formation of the bit line BL, bit line trench regions BTR may be formed between the bit lines BL. The bit line trench regions BTR may be spaced apart from each other in the second direction D2 and may be extended in the third direction D3. The edge portions EA1 and EA2 of each of the active patterns ACT, the device isolation pattern STI adjacent to the edge portions EA1 and EA2, an inner bottom surface of the node trench regions NTR, and a portion of the buffer layer may be exposed through the bit line trench regions BTR.

The line spacer LS may be formed on the side surface of the bit line BL. The formation of the line spacer LS may include removing the exposed portion of the buffer layer to form the buffer pattern BP and conformally depositing the line spacer LS on the entire top surface of the substrate 100. The exposed inner bottom surface of the node trench region NTR may be further recessed during the formation of the buffer pattern BP. Accordingly, the inner bottom surface of the node trench region NTR may have an uneven shape. The line spacer LS may cover the inner bottom surfaces of the bit line trench regions BTR and the exposed inner bottom surfaces of the node trench regions NTR.

The buried insulating pattern BI may be formed on the node trench region NTR. The buried insulating pattern BI may cover the recessed inner bottom surface of the node trench region NTR and may fill a remaining portion of the node trench region NTR. A portion of the line spacer LS may be placed between the buried insulating pattern BI and the device isolation pattern STI to serve as the buried liner BR.

Thereafter, the inner spacer INS may be conformally formed on the entire top surface of the substrate 100. The inner spacer INS may cover inner surfaces of the bit line trench regions BTR and a top surface of the buried insulating pattern BI. The formation of the inner spacer INS may include performing an atomic layer deposition (ALD) process.

Figure 7A:
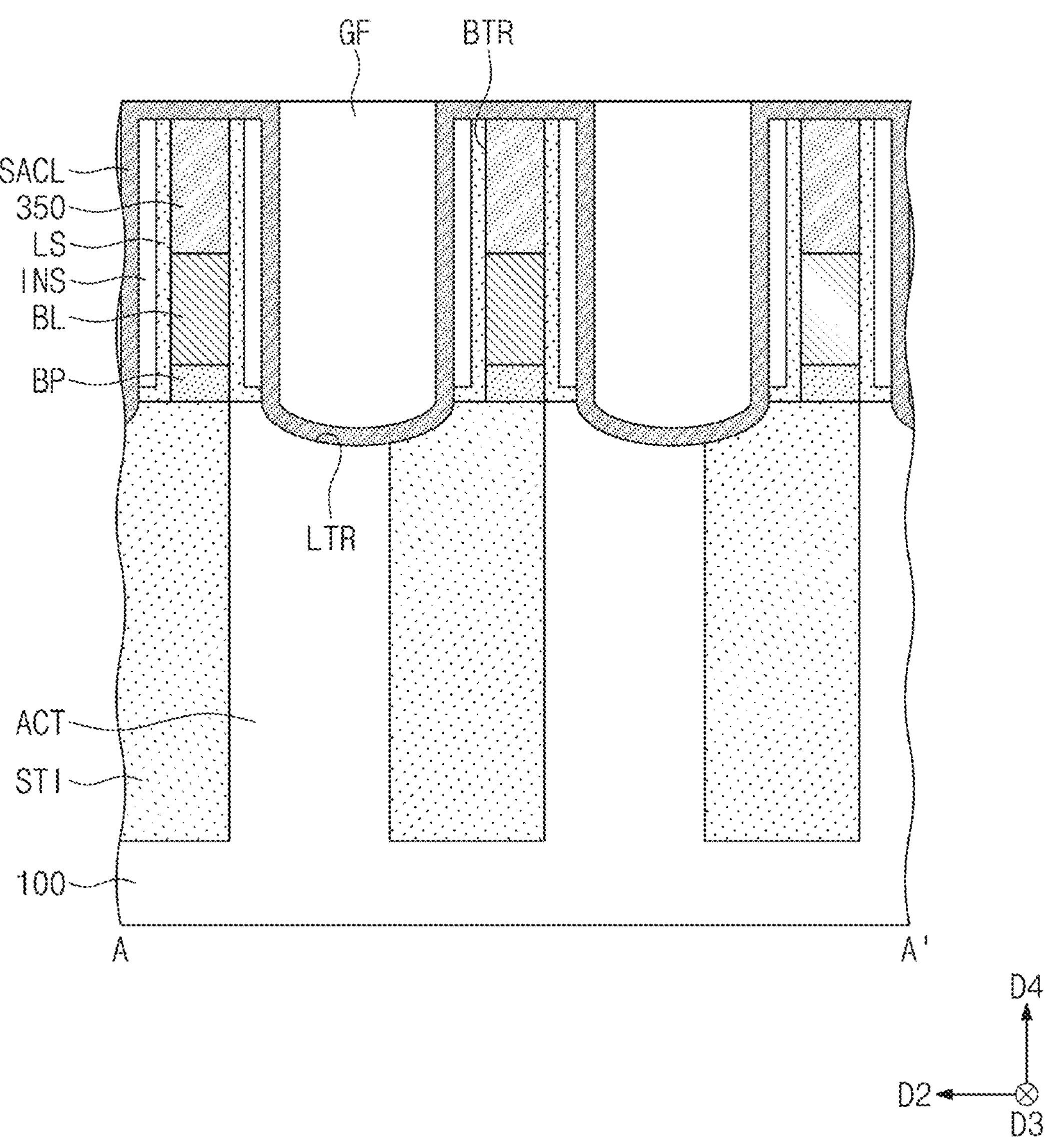
Figure 7B:
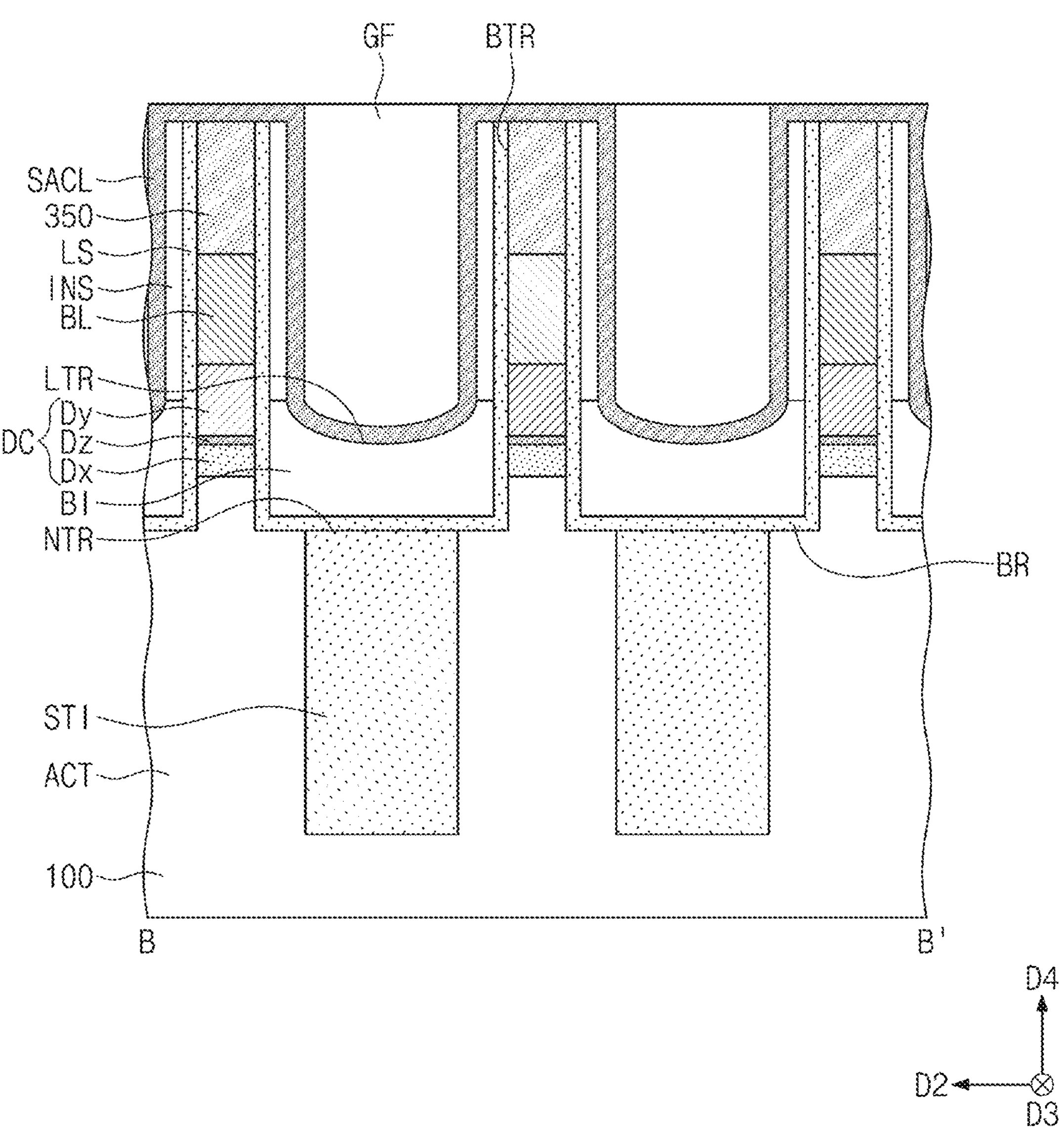

Referring to FIGS. 1, 7A, and 7B, a line trench region LTR may be formed between the bit lines BL. In detail, the line trench region LTR may be formed between outer side surfaces of the inner spacers INS, which are paired to each other and are adjacent to each other in the second direction D2. An upper portion of the line trench region LTR may be formed in the bit line trench region BTR. The line trench regions LTR may be extended in the third direction D3 and may be spaced apart from each other in the second direction D2. The inner spacer INS and the line spacer LS on the inner bottom surfaces of the bit line trench regions BTR may be etched during the formation of the line trench regions LTR. In addition, upper portion of the edge portions EA1 and EA2 of each of the active patterns ACT, the device isolation pattern STI adjacent to the upper portion, and an upper portion of the buried insulating pattern BI may be further etched and thus may be exposed to the outside. The etching process may be performed using the bit line capping patterns 350 as an etch mask.

Thereafter, a sacrificial layer SACL may be formed on the substrate 100. The sacrificial layer SACL may be formed to conformally cover the entire top surface of the substrate 100. The sacrificial layer SACL may cover the bit line capping patterns 350 and inner surfaces of the line trench regions LTR. The formation of the sacrificial layer SACL may include performing an atomic layer deposition (ALD) process. The sacrificial layer SACL may have an etch selectivity with respect to neighboring elements (e.g., the line spacer LS, the inner spacer INS, the buried insulating pattern BI, the active pattern ACT and the device isolation pattern STI, and so forth). Accordingly, even when the sacrificial layer SACL is etched in an etching process to be described below, the neighboring elements may be little or less etched. In an example, the sacrificial layer SACL may be formed of or include TiN.

After the formation of the sacrificial layer SACL, gap-fill patterns GF may be formed to fill a remaining portion of the line trench regions LTR. The gap-fill patterns GF may be extended in the third direction D3 and may be spaced apart from each other in the second direction D2. The formation of the gap-fill patterns GF may include forming a gap-fill layer (not shown) to fill the line trench regions LTR and cover the bit line capping pattern 350 and removing an upper portion of the gap-fill layer to form the gap-fill patterns GF, which are spaced apart from each other. The formation of the gap-fill layer may include performing a spin coating process. The removal of the upper portion of the gap-fill layer may include performing a polishing process on the upper portion of the gap-fill layer. After the removal process, a laser annealing process may be additionally performed. Accordingly, a seam and a void in the gap-fill pattern GF may be removed. The gap-fill patterns GF may include at least one of Tonen SilaZene (TOSZ) or carbon.

Figure 8A:
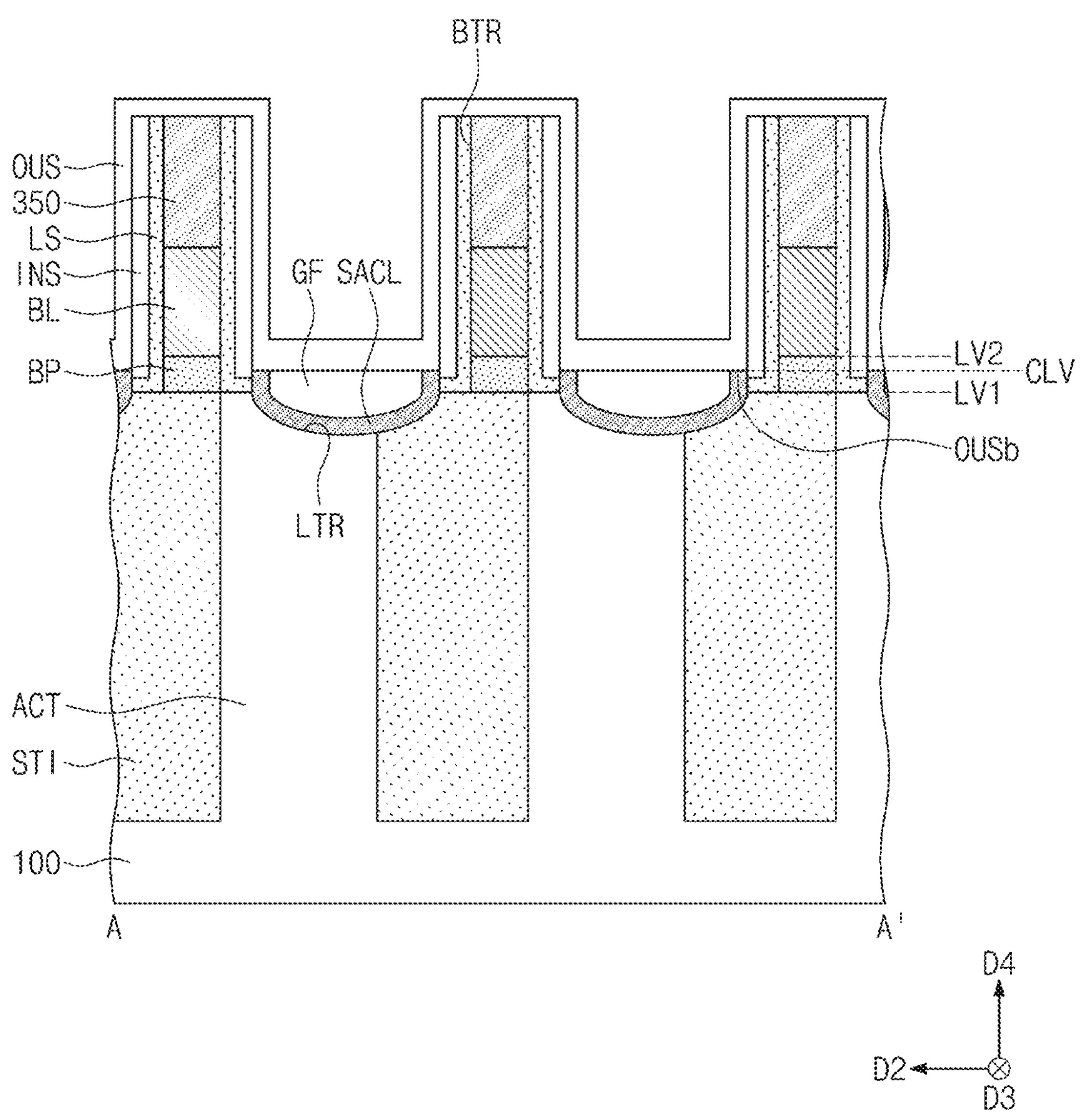
Figure 8B:
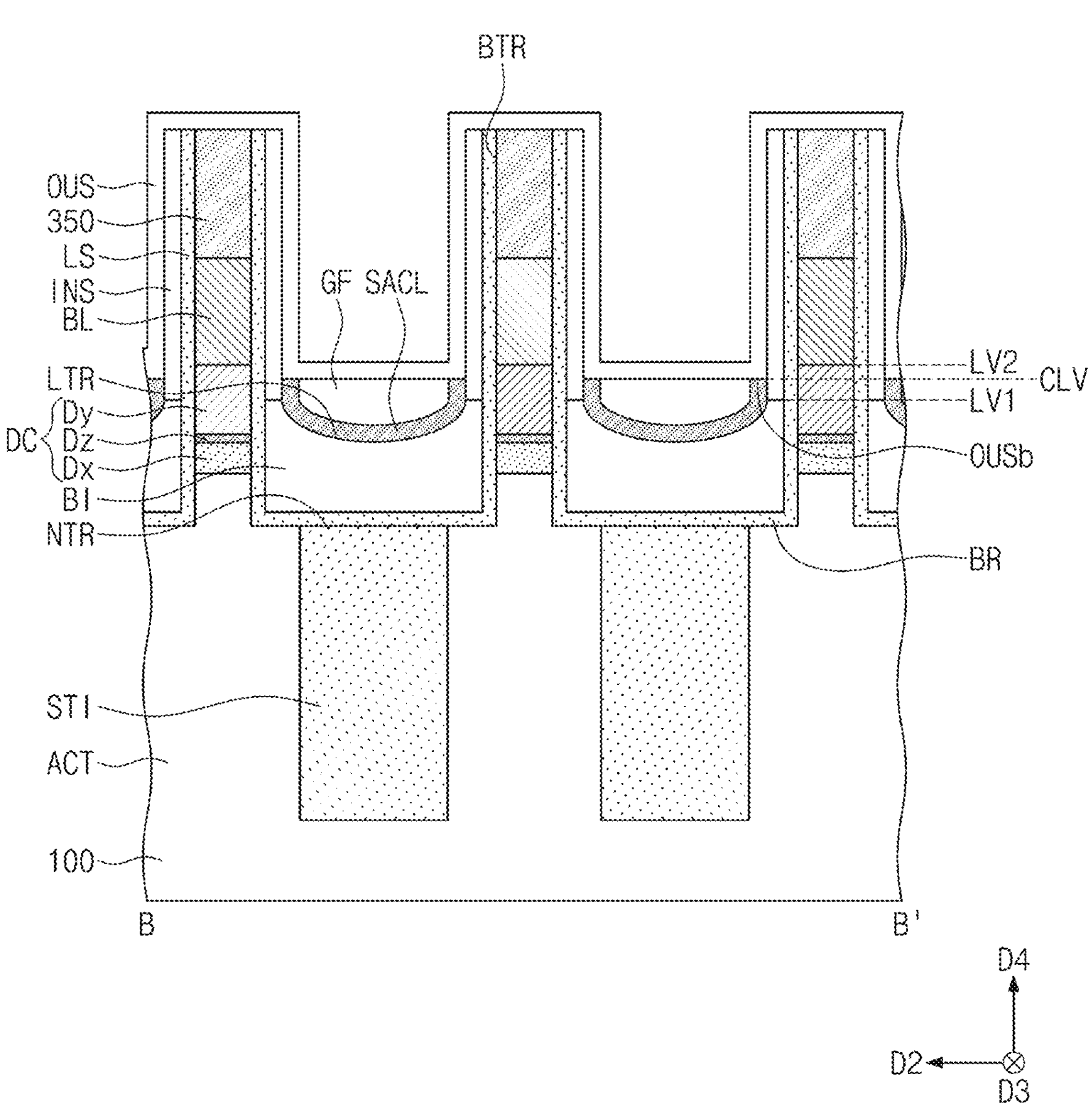

Referring to FIGS. 1, 8A, and 8B, the sacrificial layer SACL and the gap-fill pattern GF may be removed from an upper portion of the line trench region LTR. The sacrificial layer SACL and the gap-fill pattern GF may be left in a lower portion of the line trench region LTR. The removal process may be performed using the bit line capping pattern 350 as an etch mask. Each of the sacrificial layer SACL and the gap-fill pattern GF may be removed such that its top surface is placed at the contact level CLV. In an example, although not shown, each of the sacrificial layer SACL and the gap-fill pattern GF may be removed such that its top surface is placed at the first level LV1 or the second level LV2.

Next, the outer spacer OUS may be formed to conformally cover the entire top surface of the substrate 100. The outer spacer OUS may cover the bit line capping patterns 350, an inner side surface of the upper portion of the line trench region LTR, and a top surface of the gap-fill pattern GF. The bottom surface OUSb of the outer spacer OUS may be located at the contact level CLV. Although not shown, the bottom surface OUSb of the outer spacer OUS may be substantially located at the first level LV1 or the second level LV2. The formation of the outer spacer OUS may include performing an atomic layer deposition (ALD) process.

Figure 9A:
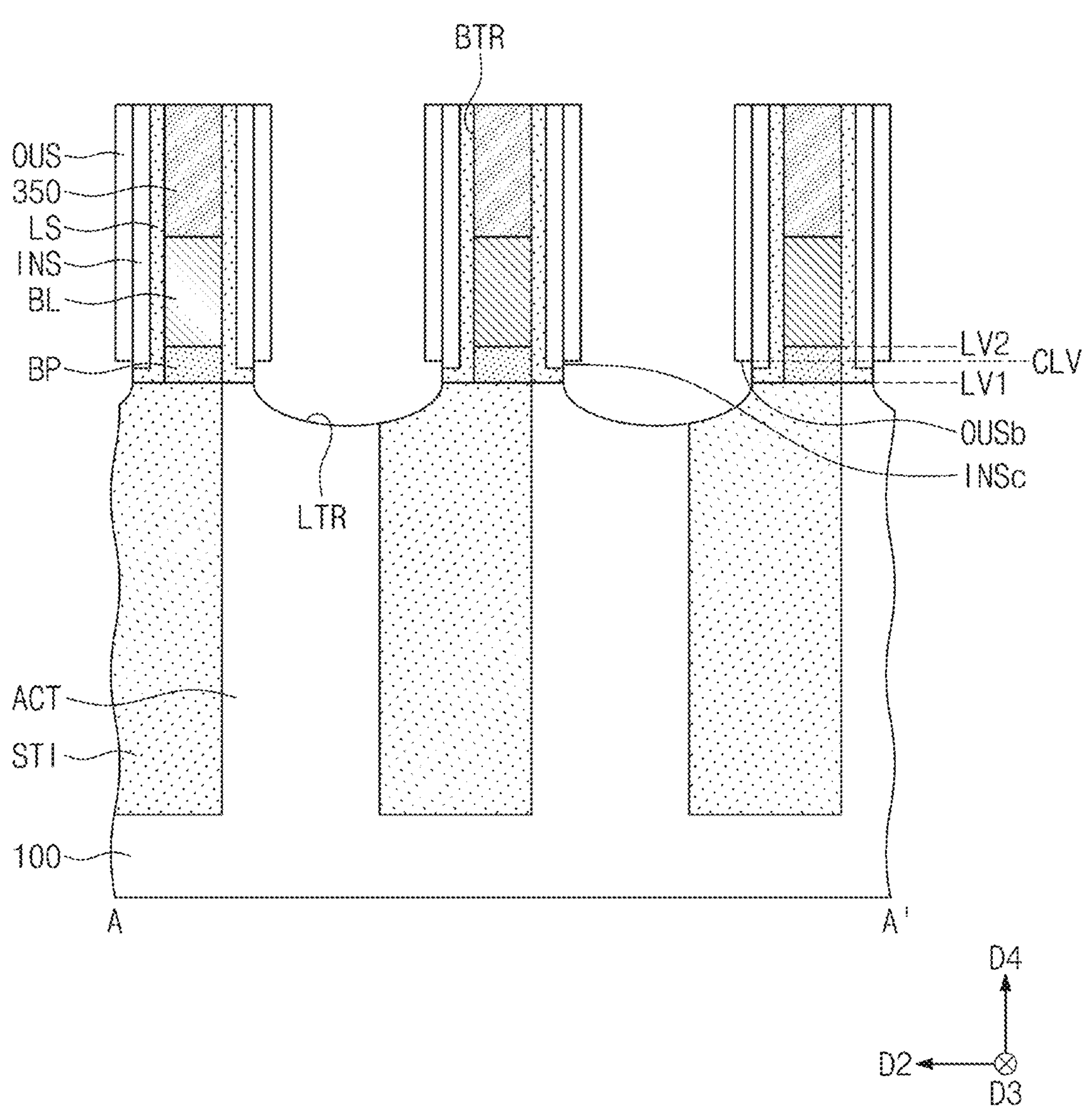
Figure 9B:
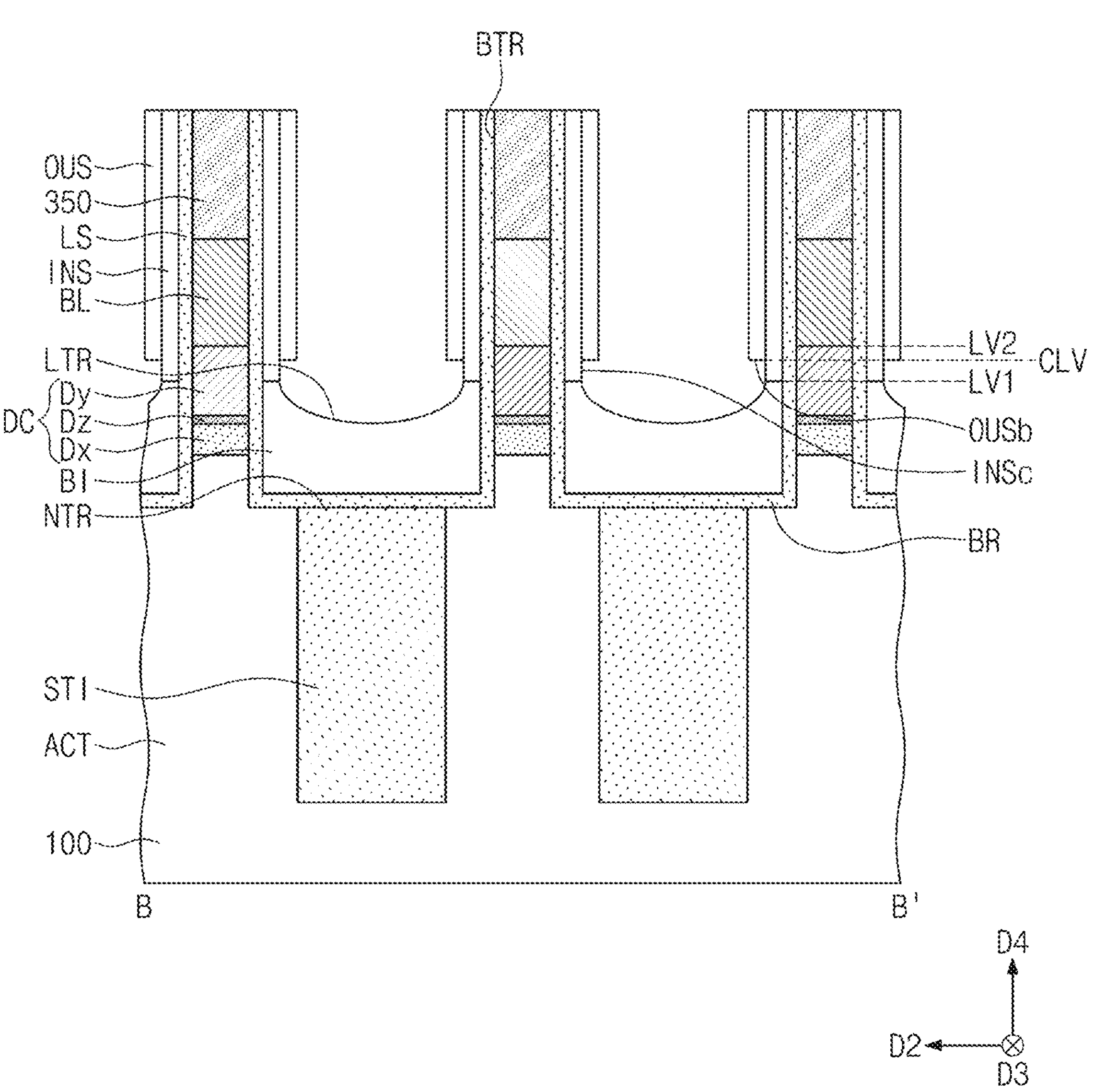

Referring to FIGS. 1, 9A, and 9B, the gap-fill pattern GF and the outer spacer OUS on the gap-fill pattern GF may be removed. The removal process may include performing an anisotropic etching process. Next, the sacrificial layer SACL may be removed. The removal of the sacrificial layer SACL may include performing an isotropic etching process. The sacrificial layer SACL and the gap-fill pattern GF may be completely removed.

In an example, the removal process may be performed to expose a bottom surface of the lower portion of the line trench region LTR. The bottom surface OUSb of the outer spacer OUS and the portion INSc of the side surface of the inner spacer INS may also be exposed to the outside. As a result of the removal process, the third width W3 of FIG. 3A may have a value larger than the fourth width W4, and the seventh width W7 of FIG. 3B may have a value larger than the eighth width W8.

Figure 10A:
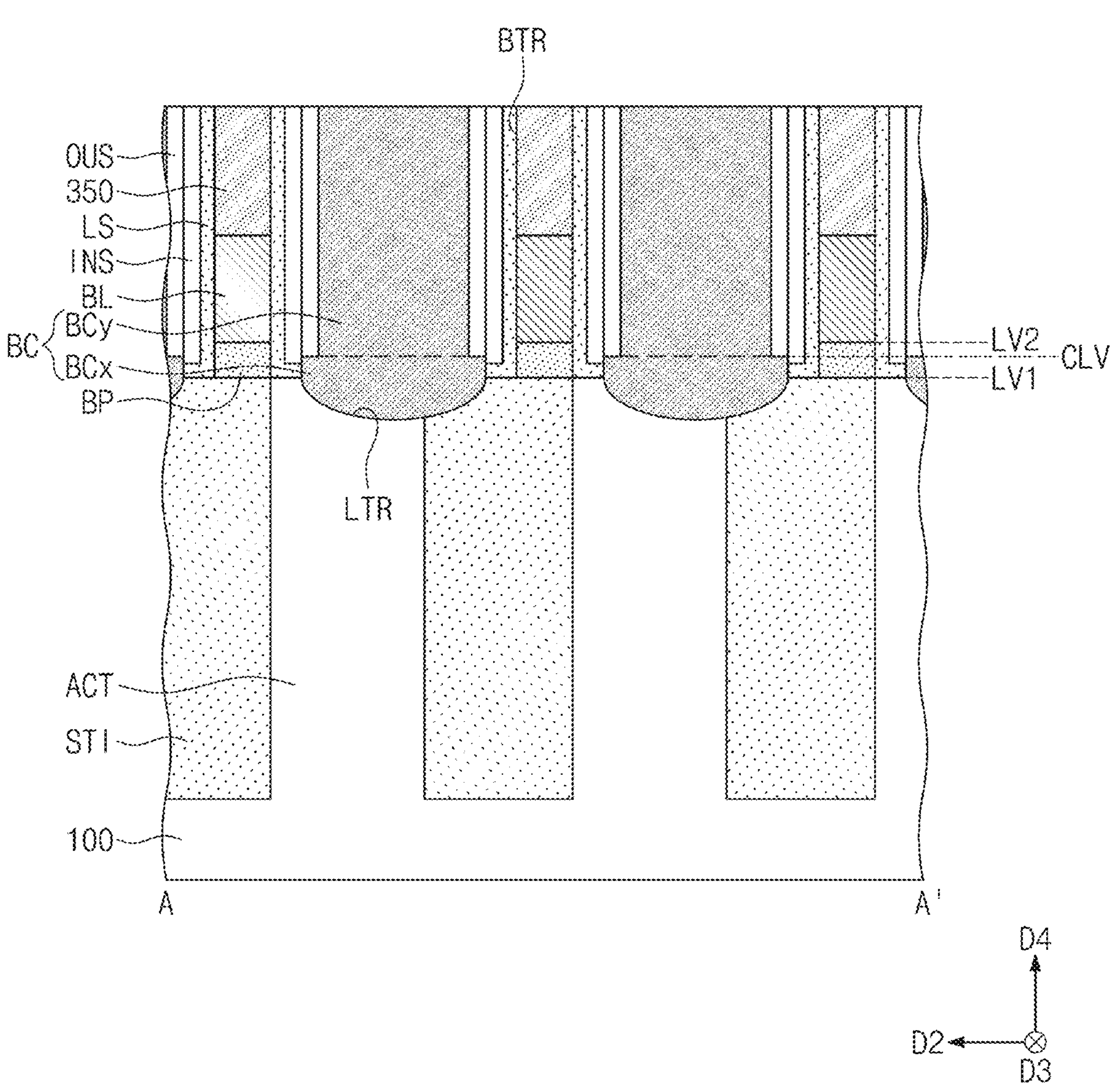
Figure 10B:
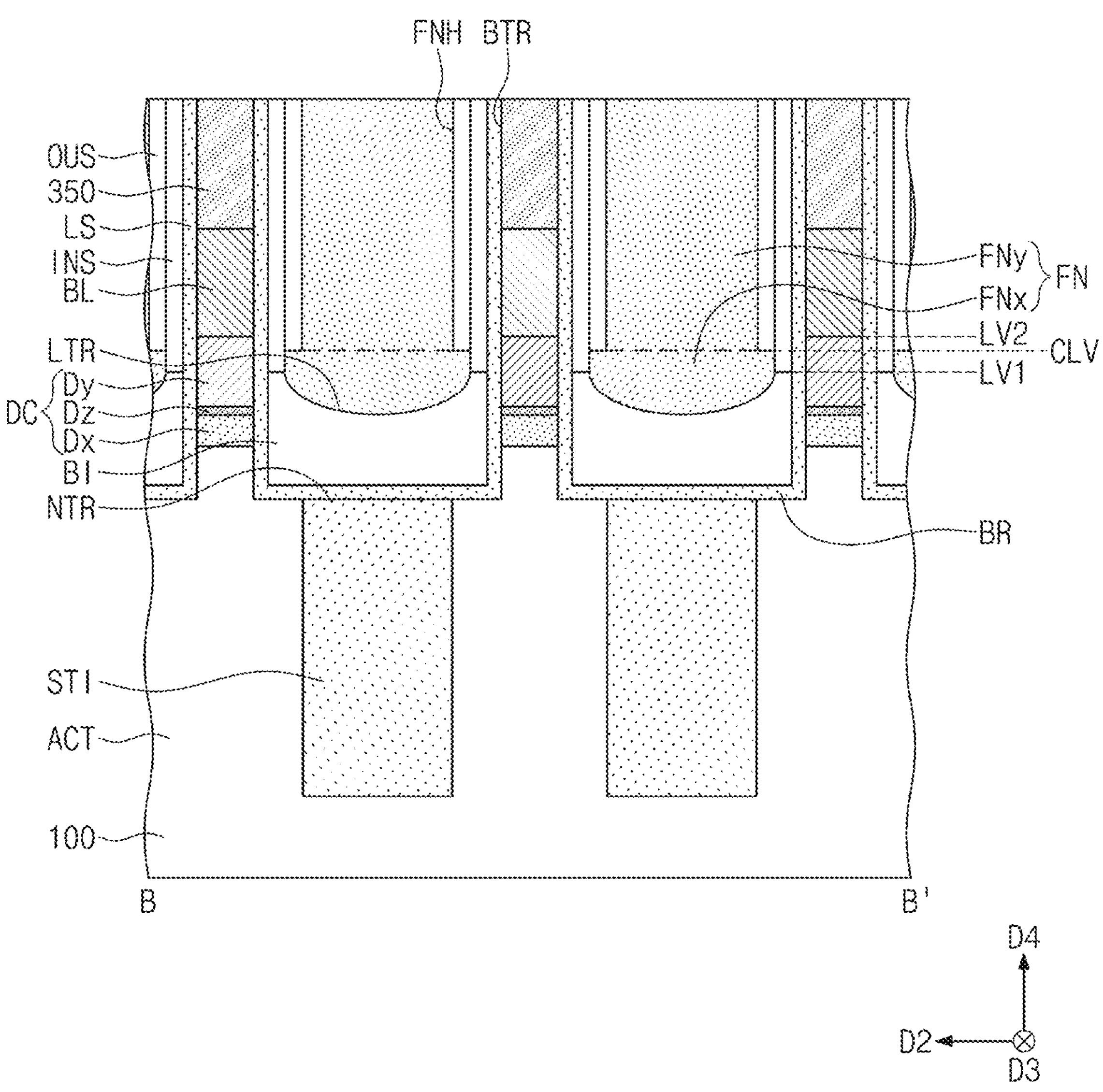

Referring to FIGS. 1, 10A, and 10B, storage node lines (not shown) may be formed to fill the line trench regions LTR. The storage node lines may be spaced apart from each other in the second direction D2 and may be extended in the third direction D3 in the line trench regions LTR.

The formation of the storage node lines may include forming a storage node layer (not shown) to fill the line trench regions LTR and cover the bit line capping pattern 350 and removing an upper portion of the storage node layer to form the storage node lines, which are spaced apart from each other. The removal of the upper portion of the storage node layer may include performing a polishing process on the upper portion of the storage node layer and the upper portion of the bit line capping pattern 350.

Thereafter, the storage node contacts BC may be formed through an embossing process, in which storage node lines are used. In other words, the storage node lines may be formed, and then, the storage node contacts BC may be formed by etching the storage node lines, respectively. The storage node contacts BC may be spaced apart from each other in each of the second and third directions D2 and D3. The storage node contacts BC may be linearly arranged in each of the second and third directions D2 and D3.

During the formation of the storage node contacts BC, fence holes FNH may be formed in the line trench regions LTR. The fence holes FNH may be defined between adjacent ones of the bit lines BL and between ones of the storage node contacts BC, which are adjacent to each other in the third direction D3. The fence holes FNH may be spaced apart from each other in the second and third directions D2 and D3 and may be linearly arranged in each of the second and third directions D2 and D3. A portion of the storage node lines may be removed from the fence holes FNH and the line trench regions LTR, which correspond to the fence holes FNH.

The formation of the fence holes FNH may include performing an etching process at least once. The formation of the fence holes FNH may include sequentially performing a first etching process and a second etching process. One of the fence holes FNH, which are adjacent to each other in the third direction D3, may be formed by the first etching process, and then, the other may be formed by the second etching process.

Next, the fence patterns FN may be formed to fill the fence holes FNH and the line trench regions LTR, which correspond to the fence holes FNH. The formation of the fence patterns FN may include forming a fence layer (not shown) to fill the fence holes FNH and the line trench regions LTR, which correspond to the fence holes FNH, and cover top surfaces of the storage node contacts BC and removing an upper portion of the fence layer to form the fence patterns FN, which are spaced apart from each other. The removal of the upper portion of the fence layer may include performing a polishing process on the upper portion of the fence layer.

Referring back to FIGS. 1 to 3B, an upper portion of the storage node contact BC may be removed. The removal of the upper portion of the storage node contact BC may include performing an etch-back process on the upper portion of the storage node contact BC.

The landing pads LP may be formed on the storage node contacts BC. The formation of the landing pads LP may include sequentially forming a landing pad layer (not shown) and mask patterns (not shown) to cover top surfaces of the storage node contacts BC and performing an anisotropic etching process using the mask patterns as an etch mask to divide the landing pad layer into a plurality of landing pads LP.

Thereafter, the filler pattern 440 may be formed in a region, which is formed by removing the landing pad layer. The filler pattern 440 may be formed to enclose each of the landing pads LP. The data storage pattern DSP may be formed on each of the landing pads LP.

Figure 11A:
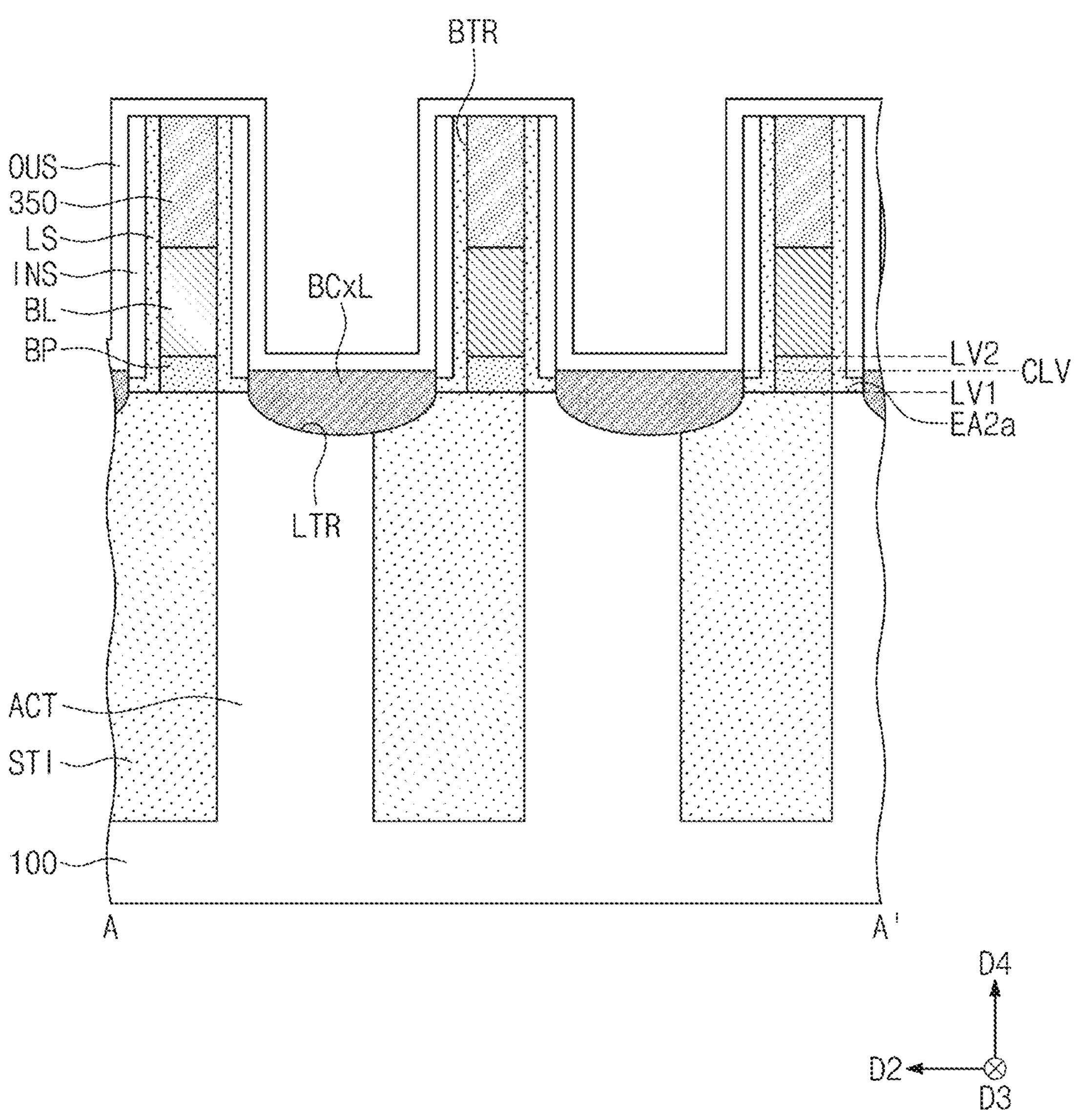
FIGS. 11A to 12B are sectional views illustrating another example of a method of fabricating a semiconductor memory device.
Figure 11B:
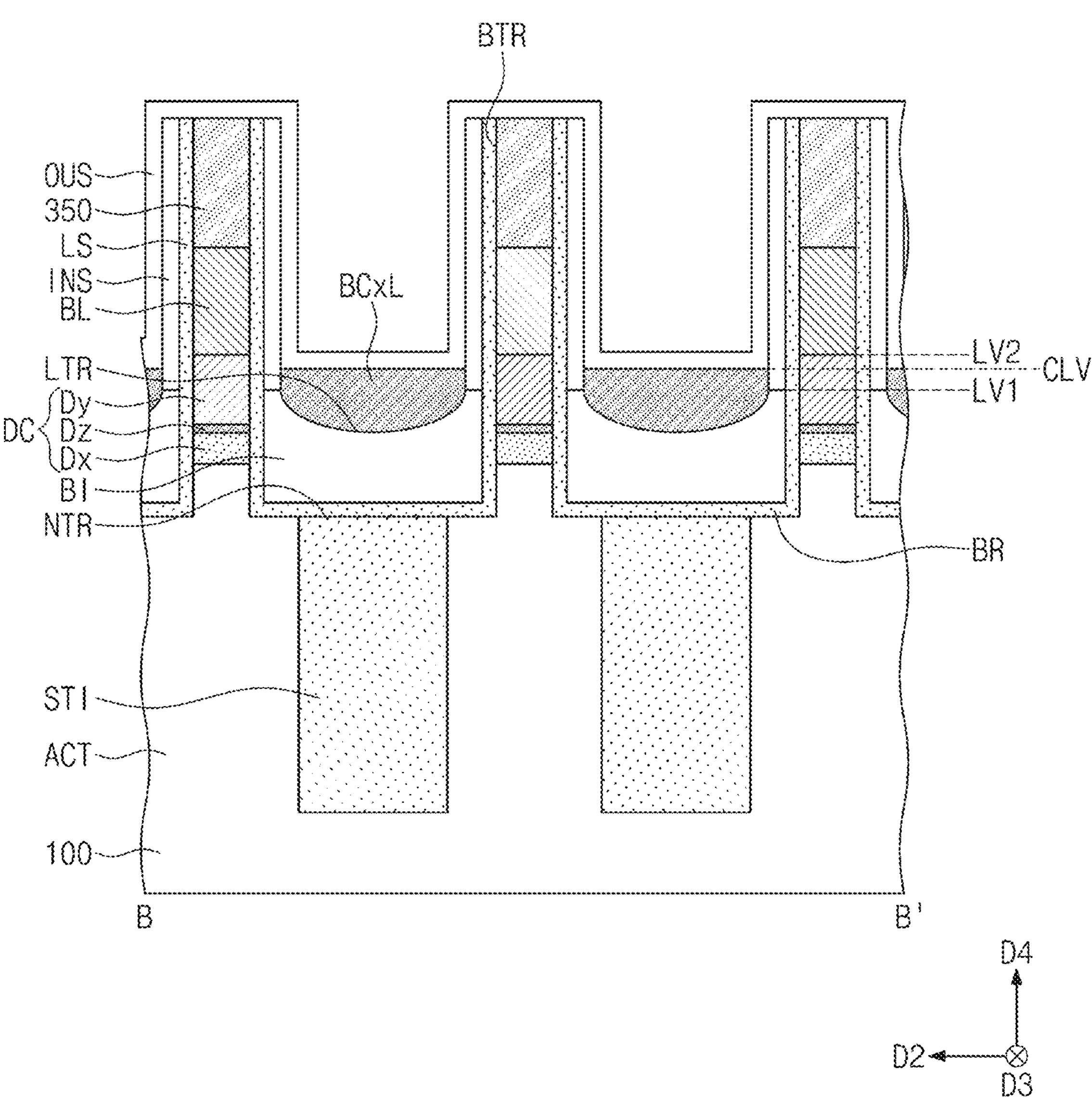
Figure 12A:
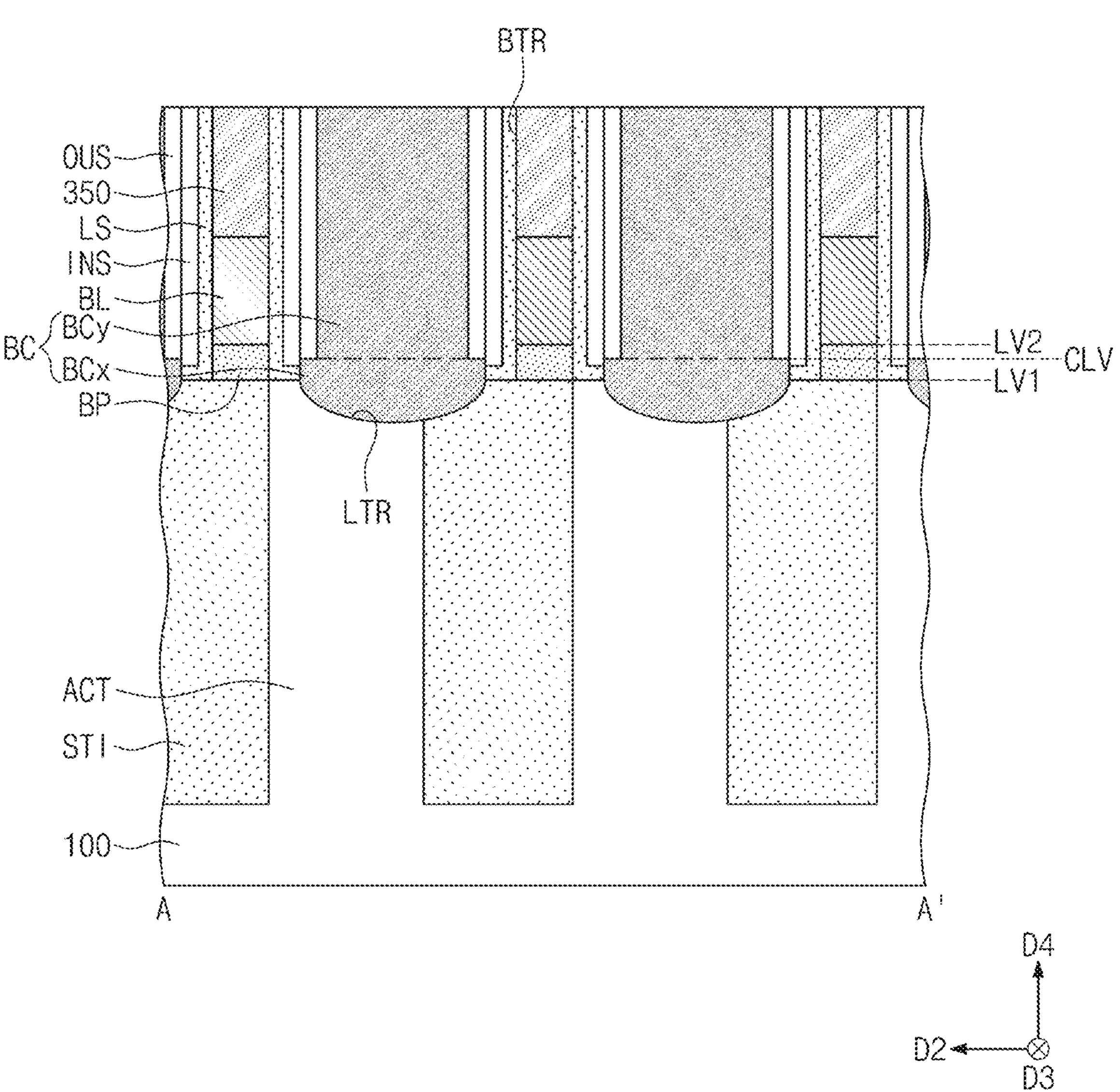
Figure 12B:
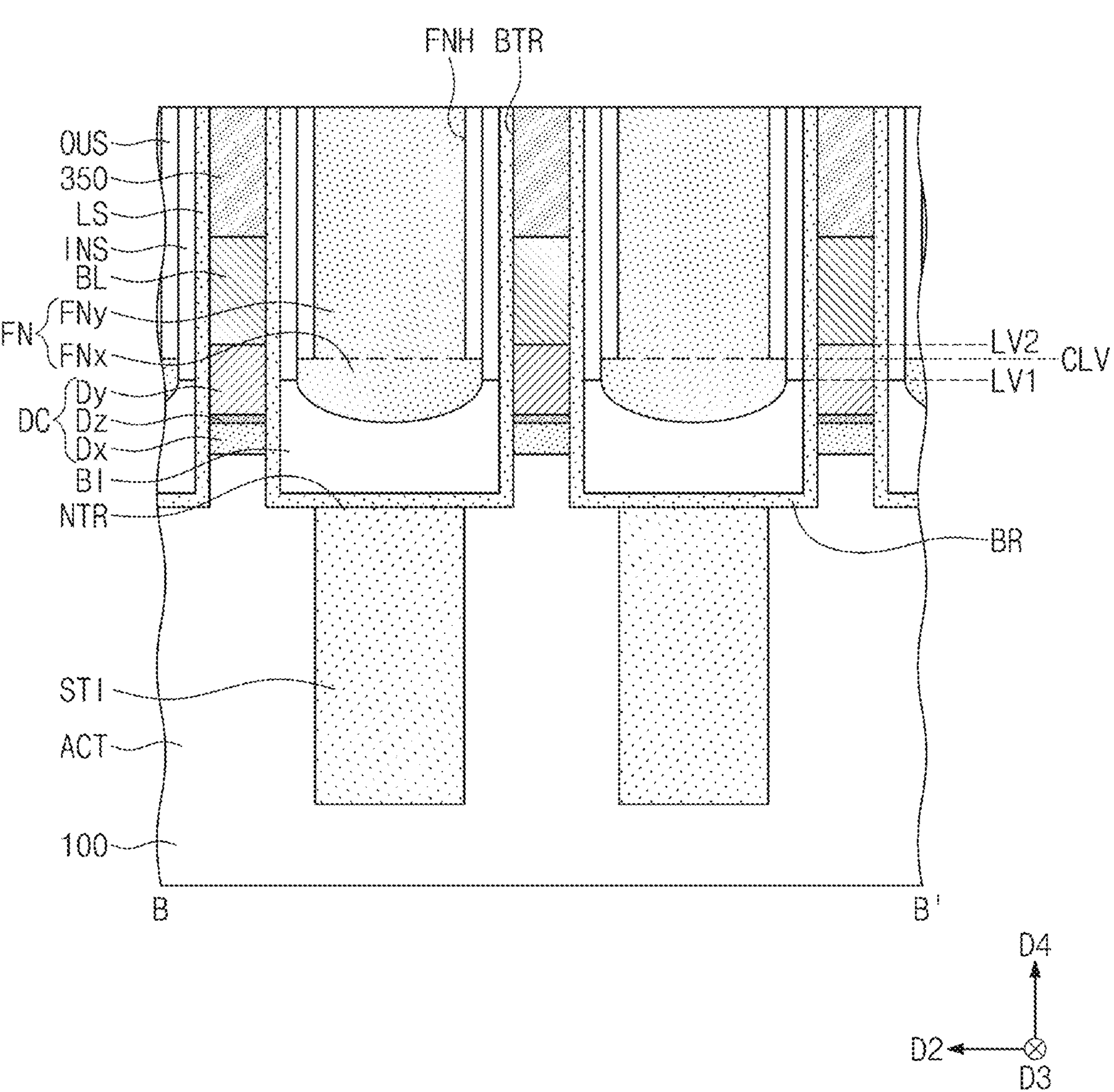

FIGS. 11A to 12B are sectional views illustrating another example of a method of fabricating a semiconductor memory device. In detail, FIGS. 11A and 12A are example sectional views corresponding to the line A-A' of FIG. 1. FIGS. 11B and 12B are example sectional views corresponding to the line B-B' of FIG. 1.

Referring to FIGS. 1, 11A, and 11B, lower storage node lines BCxL may be formed in the line trench regions LTR, after the formation of the line trench regions LTR described with reference to FIGS. 7A and 7B. The lower storage node lines BCxL may be extended in the third direction D3 in the line trench regions LTR and may be spaced apart from each other in the second direction D2. The lower storage node lines BCxL may be formed through a selective epitaxial growth process. The selective epitaxial growth process may be one of deposition methods growing a specific material on only a specific region. The lower storage node lines BCxL may be deposited to the contact level CLV. Although not shown, the lower storage node lines BCxL may be deposited to the first or second level LV1 or LV2.

Thereafter, the outer spacer OUS may be formed to conformally cover the entire top surface of the substrate 100. The outer spacer OUS may be formed by a method that is similar to that in the example described with reference to FIGS. 8A and 8B.

Referring to FIGS. 1, 12A, and 12B, upper storage node lines (not shown) may be formed to fill a remaining portion of the line trench regions LTR. The upper storage node lines may be spaced apart from each other in the second direction D2 and may be extended in the third direction D3 in the line trench regions LTR.

The formation of the upper storage node lines may include forming an upper storage node layer (not shown) to fill the line trench regions LTR and cover the bit line capping pattern 350 and removing an upper portion of the upper storage node layer to form the upper storage node lines, which are spaced apart from each other. The removal of the upper portion of the upper storage node layer may include performing a polishing process on the upper portion of the upper storage node layer and the upper portion of the bit line capping pattern 350.

Next, the upper and lower portions BCy and BCx of each of the storage node contacts BC may be formed through an embossing process, in which the upper storage node lines and the lower storage node lines BCxL are used. The embossing process may be performed in a manner that is similar to that in the example described with reference to FIGS. 10A and 10B.

The fence patterns FN may be formed between adjacent ones of the bit lines BL and between adjacent ones of the storage node contacts BC. The fence patterns FN may be formed by a method that is similar to that in the example described with reference to FIGS. 10A and 10B. Thereafter, the semiconductor memory device may be fabricated by a method that is similar to that in the example described with reference to FIGS. 1 to 3B. Here, the fabricated semiconductor memory device may have substantially the same features as those in one of the semiconductor memory devices described with reference to FIGS. 3A to 5B (e.g., the semiconductor memory device, in which the upper and lower portions BCy and BCx of the storage node contact BC have an interfacial surface at the contact level CLV).

In some implementations, it may be possible to simplify disposition of elements in a semiconductor memory device. Accordingly, it may be possible to reduce a process difficulty in a patterning process, which is performed to fabricate a semiconductor memory device, and consequently to easily fabricate the semiconductor memory device. In addition, since the elements can be disposed in a relatively simple manner, an integration density of the semiconductor memory device may also be increased.

In addition, a lower portion of a storage node contact may have a width that is larger than a width of an upper portion. Accordingly, a contact area between the storage node contact and an active pattern may be increased, and even when the storage node contact is misaligned, the storage node contact may be in contact with the active pattern. As a result, it may be possible to improve the electrical characteristics of the semiconductor memory device and increase the productivity in a process of the semiconductor memory device.

While this specification contains many specific implementation details, these should not be construed as limitations on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

While example implementations of the present disclosure have been particularly shown and described, it will be understood by one of ordinary skill in the art that variations in form and detail may be made therein without departing from the spirit and scope of the attached claims.

What is claimed is:

1. A semiconductor memory device, comprising:

a first active pattern and a second active pattern, which are extended in a first direction and are disposed side by side in a second direction, each of the first and second active patterns including a first edge portion and a second edge portion separated from the first edge portion in the first direction;

a pair of word lines disposed to cross each of the first and second active patterns;

a pair of bit lines disposed on each of the first and second active patterns and extended in a third direction; and a storage node contact on the first edge portion of the first active pattern, wherein, when measured in the second direction, a first width of the storage node contact at a first level is larger than a second width at a second level, the first level is lower than the second level, and the first to third directions are chosen to cross each other.

2. The semiconductor memory device of claim 1, wherein, between the pair of bit lines, the first edge portion of the first active pattern is adjacent to the second edge portion of the second active pattern in the third direction.

3. The semiconductor memory device of claim 1, wherein the storage node contact is a first storage node contact, the semiconductor memory device further comprises a second storage node contact on the second edge portion of the second active pattern, and the first storage node contact is separated from the second storage node contact between the pair of bit lines in the third direction.

4. The semiconductor memory device of claim 1, further comprising a third active pattern, which is extended in the first direction, wherein the third active pattern and the first active pattern are disposed side by side in the first direction, and the third active pattern and the second active pattern are disposed side by side in the third direction.

5. The semiconductor memory device of claim 1, wherein the first level is a level of a top surface of the first edge portion of the first active pattern, and the second level is a level of a bottom surface of each of the pair of bit lines.

6. The semiconductor memory device of claim 1, further comprising an outer spacer between one of the pair of bit lines and the storage node contact, wherein a bottom surface of the outer spacer is located at a level that is higher than or equal to the first level and is lower than or equal to the second level.

7. The semiconductor memory device of claim 6, further comprising an inner spacer, which is disposed between the one of the pair of bit lines and the outer spacer, wherein the bottom surface of the outer spacer is located at a level, which is equal to or higher than a bottommost surface of the inner spacer.

8. The semiconductor memory device of claim 6, wherein the storage node contact covers the bottom surface of the outer spacer.

9. The semiconductor memory device of claim 1, wherein the storage node contact is a first storage node contact, and wherein the semiconductor memory device further comprises:

a second storage node contact on the second edge portion of the second active pattern; and a fence pattern between the first and second storage node contacts, wherein a width of the fence pattern at the first level is larger than a width at the second level, when measured in the second direction.

10. A semiconductor memory device, comprising:

a first active pattern and a second active pattern, which are extended in a first direction and are disposed side by side in a second direction, each of the first and second active patterns including a first edge portion and a second edge portion separated from the first edge portion in the first direction;

a pair of word lines disposed to cross each of the first and second active patterns;

a pair of bit lines disposed on each of the first and second active patterns and extended in a third direction; and a storage node contact on the first edge portion of the first active pattern, wherein the storage node contact includes upper portion and lower portion distinct from the upper portion at a contact level, a width of the lower portion of the storage node contact is larger than a width of the upper portion, when measured at the contact level in the second direction, and the first to third directions are chosen to cross each other.

11. The semiconductor memory device of claim 10, wherein there is no interfacial surface between the upper and lower portions of the storage node contact at the contact level.

12. The semiconductor memory device of claim 10, wherein there is an interfacial surface between the upper and lower portions of the storage node contact at the contact level.

13. The semiconductor memory device of claim 10, wherein the contact level is a level that is higher than or equal to a top surface of the first edge portion of the first active pattern and is lower than or equal to a bottom surface of each of the pair of bit lines.

14. The semiconductor memory device of claim 10, wherein a top surface of the first edge portion of the first active pattern is located at a first level, and the width of the lower portion of the storage node contact at the contact level is larger than or equal to a width at the first level, when measured in the second direction.

15. The semiconductor memory device of claim 10, further comprising:

an inner spacer between one of the pair of bit lines and the storage node contact; and an outer spacer between the inner spacer and the storage node contact, wherein a bottom surface of the outer spacer is located at a level which is equal to or higher than a bottommost surface of the inner spacer.

16. The semiconductor memory device of claim 15, wherein the lower portion of the storage node contact comprises a portion of a side surface of the inner spacer.

17. The semiconductor memory device of claim 15, wherein a top surface of the lower portion of the storage node contact covers the bottom surface of the outer spacer.

18. The semiconductor memory device of claim 15, wherein the contact level is a level of the bottom surface of the outer spacer.

19. The semiconductor memory device of claim 10, wherein the storage node contact is a first storage node contact, and the semiconductor memory device further comprises:

a second storage node contact on the second edge portion of the second active pattern; and a fence pattern between the first and second storage node contacts, wherein the fence pattern includes upper and lower portions, the upper portion is a portion of the fence pattern located at a level higher than the contact level, the lower portion is another portion of the fence pattern located at a level lower than the contact level, and a width of the lower portion of the fence pattern is larger than a width of the upper portion of the fence pattern, when measured at the contact level in the second direction.

20. A semiconductor memory device, comprising:

a first active pattern and a second active pattern, which are extended in a first direction and are disposed side by side in a second direction crossing the first direction, each of the first and second active patterns including a first edge portion and a second edge portion separated from the first edge portion in the first direction;

a pair of word lines extended in the second direction to cross the first active pattern and the second active pattern;

a first storage node contact on the first edge portion of the first active pattern;

a second storage node contact on the second edge portion of the second active pattern;

a first bit line disposed on the first active pattern and extended in a third direction crossing the first and second directions;

a second bit line disposed on the second active pattern and extended in the third direction;

a fence pattern between the first and second storage node contacts;

landing pads on the first and second storage node contacts; and data storage patterns on the landing pads, wherein the first edge portion of the first active pattern and the first edge portion of the second active pattern are adjacent to each other in the second direction, the first edge portion of the first active pattern and the second edge portion of the second active pattern are adjacent to each other in the third direction, a first width of each of the first and second storage node contacts at a first level is larger than a second width at a second level, when measured in the second direction, and the first level is lower than the second level.

* * * * *